(12) United States Patent
Tsai et al.

(10) Patent No.: US 8,878,459 B2
(45) Date of Patent: Nov. 4, 2014

(54) METHOD FOR IDENTIFYING RATED POWER OF HID LAMP

(75) Inventors: Wen-Tien Tsai, Liuqiu Township, Pingtung County (TW); Ching-Ran Lee, Jinning Township, Kinmen County (TW)

(73) Assignee: Industrial Technology Research Institute, Hsinchu (TW)

( * ) Notice: Subject to any disclaimer, the term of this patent is extended or adjusted under 35 U.S.C. 154(b) by 172 days.

(21) Appl. No.: 13/425,196

(22) Filed: Mar. 20, 2012

(65) Prior Publication Data
US 2013/0049638 A1    Feb. 28, 2013

(30) Foreign Application Priority Data
Aug. 31, 2011   (TW) .............. 100131289 A

(51) Int. Cl.
*H05B 41/36* (2006.01)
*G01R 31/24* (2006.01)

(52) U.S. Cl.
CPC .................. G01R 31/245 (2013.01)
USPC ........................... 315/307; 315/326

(58) Field of Classification Search
USPC ....... 315/307, 308, 200 R, 291, 360, 326, 88, 315/89, 92
See application file for complete search history.

(56) References Cited

U.S. PATENT DOCUMENTS

| | | | |
|---|---|---|---|
| 6,501,235 B2 | 12/2002 | Ortmeyer | |
| 7,425,802 B2 * | 9/2008 | Kumagai et al. | 315/291 |
| 8,148,920 B2 * | 4/2012 | Lee et al. | 315/308 |
| 2005/0194916 A1 * | 9/2005 | Okawa et al. | 315/308 |
| 2007/0210723 A1 * | 9/2007 | Kumagai et al. | 315/209 M |
| 2010/0060201 A1 * | 3/2010 | Lee et al. | 315/307 |

FOREIGN PATENT DOCUMENTS

| | | |
|---|---|---|
| CN | 1947470 A | 4/2007 |
| CN | 101730359 | 6/2010 |
| CN | 102027809 A | 4/2011 |
| EP | 2161972 A2 | 3/2010 |
| JP | 2011113763 A | 6/2011 |
| TW | 214598 | 10/1993 |
| TW | 200517016 A | 5/2005 |
| TW | I231852 | 5/2005 |
| TW | 201012296 | 3/2010 |
| TW | M388604 | 9/2010 |

OTHER PUBLICATIONS

English language translation of abstract of TW I231852 (published May 1, 2005).
English language translation of abstract of TW 201012296 (published Mar. 16, 2010).
English language translation of abstract of CN 101730359 (published Jun. 9, 2010).
English language translation of abstract of TW M388604 (published Sep. 11, 2010).

(Continued)

*Primary Examiner* — Daniel D Chang
(74) *Attorney, Agent, or Firm* — McClure, Qualey & Rodack, LLP

(57) ABSTRACT

A method for identifying a rated power of a HID lamp includes the steps of: outputting a first driving signal and a second driving signal to drive the HID lamp in order, and calculating a first electric characteristic variation of the HID lamp; and identifying the rated power of the HID lamp according to the first electric characteristic variation and a first default value.

20 Claims, 25 Drawing Sheets

(56) References Cited

OTHER PUBLICATIONS

Tsai, W.T., et al.; "Starting Scenario of Identifying Metal Halide Lamps' Rated Powers;" 6th Taiwan Power Electronics Conference; 2007; pp. 965-969.
Tang, S.Y., et al.; "Identification of 35-W and 70-W Metal Halide Lamps;" pp. 213-214.
"Starting Strategy for Recognizing Rated Power of Metal Halide Lamp;" Power Electronic Bimonthly; vol. 6; No. 5; 2008; pp. 30-37.
Tsai, W.T., et al.; "An Electronic Ballast with Automatic Identification of Rated Power for Metal Halide Lamps;" 29th Power Engineering Conference; 2008; pp. 2346-2350.
Tsai, W.T., et al.; "An Electronic Ballast of Two-Stage Circuit Configuration of Metal Halide Lamps;" 9th Taiwan Power Electronics Conference and Exhibition; 2010; pp. 336-340.
TW Office Action dated Dec. 11, 2013.
CN Office Action dated Jun. 27, 2014.
Full English (machine) translation of CN102027809 (Published Apr. 20, 2011).
Full English (machine) translation of CN1947470 (Published Apr. 11, 2007).
English Abstract translation of JP2011113763 (Published Jun. 9, 2011).

* cited by examiner

|              | V1(V) | t(s) | Vt(V) |
|:---:|:---:|:---:|:---:|
| GE70W        | 76.4  | 50   | 76.9  |
| OSRAM70W     | 69.1  | 10   | 69.7  |
| PHILIPS70W   | 70.6  | 40   | 71.6  |
| GE150W       | 92.9  | 250  | 78.5  |
| OSRAM150W    | 109.1 | 250  | 83.7  |
| PHILIPS150W  | 76.9  | 250  | 67.2  |

FIG. 13

|  | I1(A) | t(s) | It(A) |
|---|---|---|---|
| GE70W | 1.124 | 30 | 0.983 |
| OSRAM70W | 1.227 | 10 | 1.124 |
| PHILIPS70W | 1.048 | 35 | 0.940 |
| GE150W | 0.946 | 250 | 0.968 |
| OSRAM150W | 0.962 | 250 | 0.961 |
| PHILIPS150W | 1.187 | 150 | 1.047 |

FIG. 16

|      | V1(V) | t(s) | Vt(V) |
|------|-------|------|-------|
| 70W  | 108.0 | 100  | 96.1  |
| 150W | 87.6  | 100  | 87.5  |

FIG. 21

| | P1(W) | t(s) | Pt(W) |
|---|---|---|---|
| 70W | 105 | 100 | 94 |
| 150W | 85 | 100 | 85 |

METHOD FOR IDENTIFYING RATED POWER OF HID LAMP

This application claims the benefit of Taiwan application Serial No. 100131289, filed Aug. 31, 2011, the disclosure of which is incorporated by reference herein in its entirety.

BACKGROUND

1. Technical Field

The disclosed embodiments relate to a method for identifying a rated power of a HID lamp.

2. Description of the Related Art

In high intensity discharge (HID) lamps, such as metal halide lamps, high pressure sodium lamps or mercury vapor lamps, a pressurized electric arc, produced by tungsten electrodes on two sides of the HID lamp, passes through the lamp and then light rays are outputted. These lamps are full with the gas and metal. The gas assists in activating the lamp and the metal is heated to the evaporation point to form the plasma state and the light rays are then outputted. The HID lamps have been recently applied to various illumination occasions, such as gyms, warehouses, theaters, roads, parking areas, roadway or the like.

The HID lamp needs an electronic ballast to trigger and keep the internal electric arc. At present, the commercially available HID lamps need the corresponding electronic ballasts according to the rated powers thereof. For example, the 70W HID lamp needs to use the 70W ballast, and the 150W HID lamp needs to use the 150W ballast. If the ballast is incorrectly chosen, the lifetime of the HID lamp is significantly affected. Therefore, the identification of the rated power of the HID lamp becomes important.

SUMMARY

The disclosure is directed to a method for identifying a rated power of a HID lamp.

According to one embodiment, a method for identifying a rated power of a HID lamp is provided. The method includes the steps of: outputting a first driving signal and a second driving signal to drive the HID lamp in order, and calculating a first electric characteristic variation of the HID lamp; and identifying the rated power of the HID lamp according to the first electric characteristic variation and a first default value.

BRIEF DESCRIPTION OF THE DRAWINGS

FIG. 13 shows a list of the voltages and the times of the GE70W, OSRAM70W, PHILIPS70W, GE150W, OSRAM150W and PHILIPS150W HID lamps.

FIG. 16 shows a list of currents and times of the GE70W, OSRAM70W, PHILIPS70W, GE150W, OSRAM150W and PHILIPS150W HID lamps.

FIG. 21 shows a list of voltages and times for driving the 70W and 150W HID lamps with the constant current.

Figure 1:
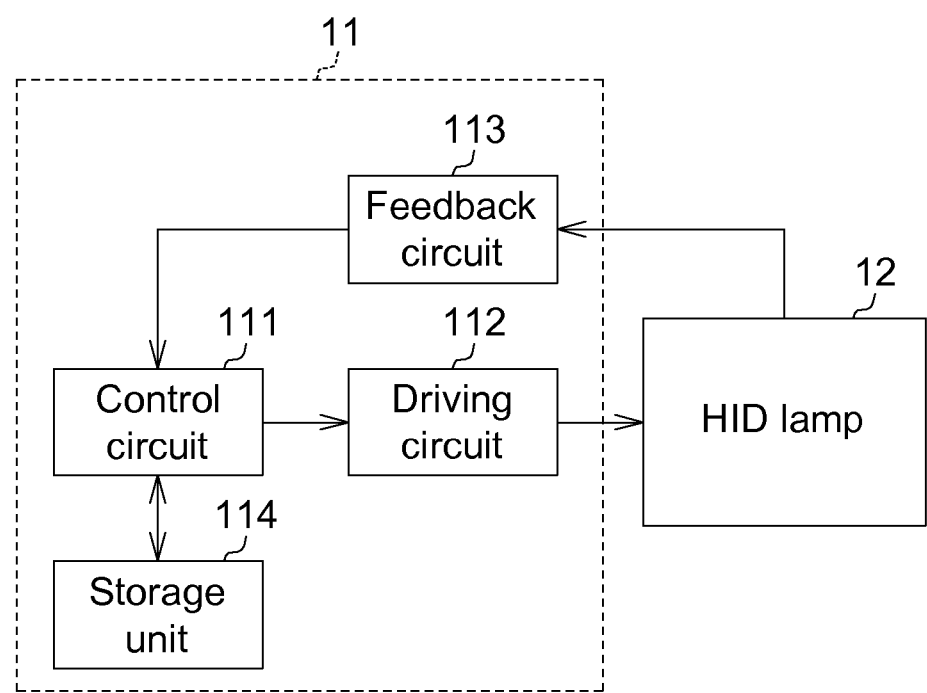
FIG. 1 shows a schematic block diagram of electronic ballast for driving a HID lamp.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 2:
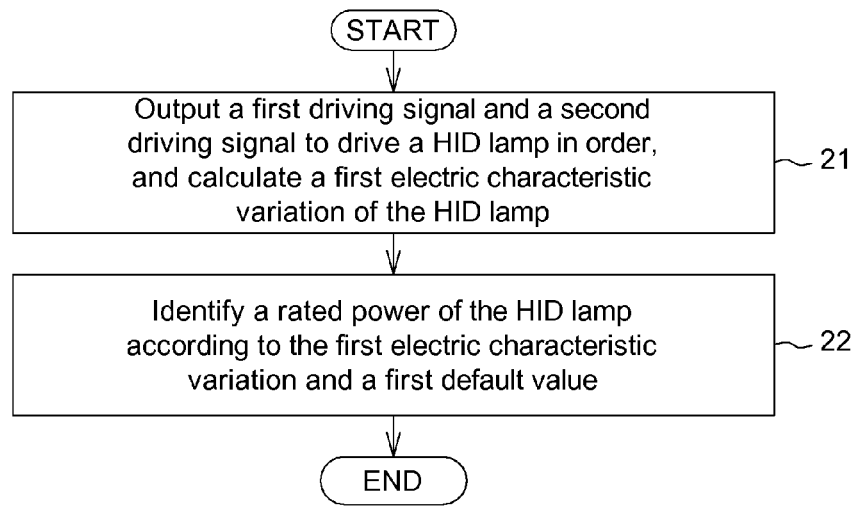
FIG. 2 shows a flow chart of a method for identifying the rated power of the HID lamp.

FIG. 1 shows a schematic block diagram of electronic ballast 11 for driving a HID lamp 12. FIG. 2 shows a flow chart of a method for identifying the rated power of the HID lamp 12. Referring to FIGS. 1 and 2, the ballast 11 for driving the HID lamp 12 includes a control circuit 111, a driving circuit 112, a feedback circuit 113 and a storage unit 114. The method for identifying the rated power of the HID lamp includes the following steps.

As shown in step 21, the control circuit 111 controls the driving circuit 112 to output a first driving signal and a second driving signal to drive the HID lamp 12 in order, and calculates a first electric characteristic variation of the HID lamp 12. As shown in step 22, the control circuit 111 identifies the rated power of the HID lamp 12 according to the first electric characteristic variation and a first default value.

The first electric characteristic variation is obtained according to the electric characteristics generated by the HID lamp 12 at different predetermined times. For example, the HID lamp 12 generates a first electric characteristic and a second electric characteristic at a first predetermined time and a second predetermined time, respectively. The feedback circuit 113 feeds the electric characteristic of the HID lamp 12 back to the control circuit 111, and the storage unit 114 stores the default value of the electric characteristic variation of the HID lamp 12. The second driving signal is outputted after the HID lamp 12 enters the steady state, for example. Generally speaking, the voltage has fluctuations for a period of time before reaching the rated value, and this temporary transitional phenomenon is referred to the starting transient. The state, in which the voltage is kept constant, is referred to as a steady state. Usually, the steady state is regarded as being entered when the voltage reaches 90% of the rated-voltage.

The first driving signal and the second driving signal are powers or currents, for example. When the first driving signal and the second driving signal are the powers, the first electric characteristic and the second electric characteristic are voltages or currents, for example. When the first driving signal and the second driving signal are the currents, the first electric characteristic and the second electric characteristic are voltages or powers, for example.

Figure 3:
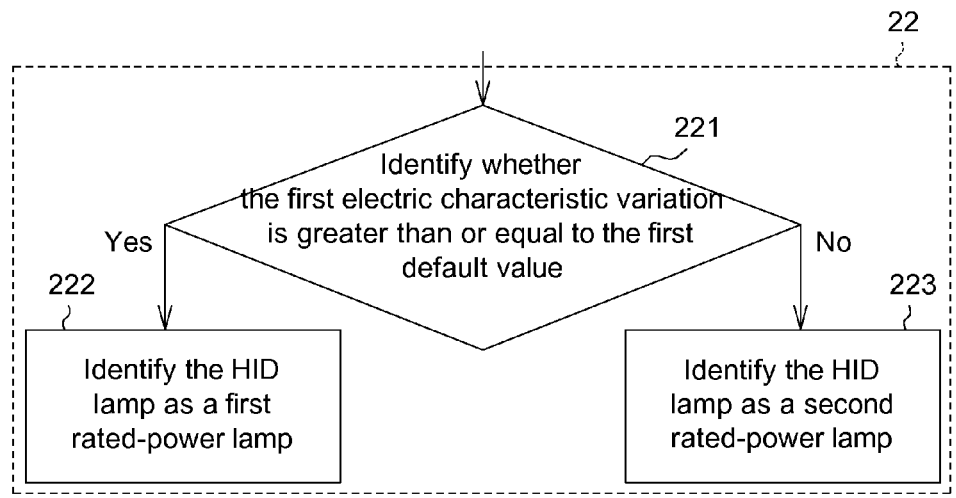
FIG. 3 shows a first detailed flow chart of the step 22.

Please refer to FIGS. 1 and 3, wherein FIG. 3 shows a first detailed flow chart of the step 22. In this embodiment, the steps of identifying the HID lamps with two rated powers are disclosed. In FIG. 3, the step 22 further includes steps 221 to 223. As shown in the step 221, the control circuit 111 identifies whether the first electric characteristic variation is greater than or equal to the first default value. If yes, the step 222 is performed. As shown in the step 222, when the first electric characteristic variation is greater than or equal to the first default value, the control circuit 111 identifies the HID lamp 12 as a first rated-power lamp. Oppositely, when the first electric characteristic variation is smaller than the first default value, the control circuit 111 identifies the HID lamp 12 as a second rated-power lamp, as shown in the step 223. After the rated power of the HID lamp 12 has been identified, the operation parameters of the ballast 11 can be subsequently adjusted according to the rated power of the HID lamp 12.

Figure 4:
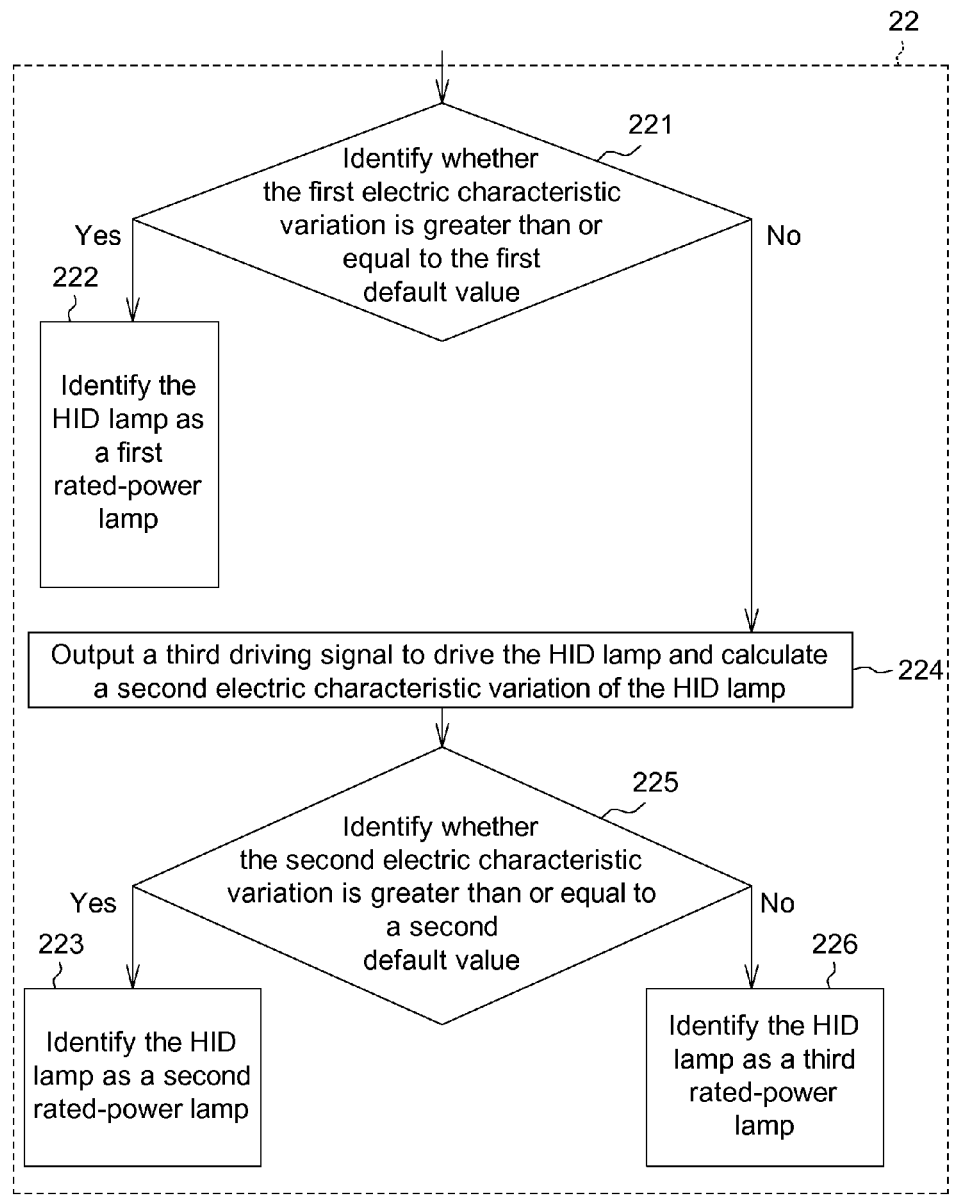
FIG. 4 shows a second detailed flow chart of the step 22.

Please refer to FIGS. 1 and 4, wherein FIG. 4 shows a second detailed flow chart of the step 22. In this embodiment, the steps of identifying the HID lamps with three rated powers are disclosed, and the steps of identifying the HID lamps with more than three rated powers will not be described because the steps can be analogized according to the following steps. In FIG. 4, the step 22 further includes steps 221 to 226. As shown in the step 221, the control circuit 111 identifies whether the first electric characteristic variation is greater than or equal to the first default value. If yes, the step 222 is performed. As shown in the step 222, when the first electric characteristic variation is greater than or equal to the first default value, the control circuit 111 identifies the HID lamp 12 as the first rated-power lamp. Oppositely, when the electric characteristic variation is smaller than the default value, as shown in the step 224, when the first electric characteristic variation is smaller than the first default value, the control circuit 111 controls the driving circuit 112 to output a third driving signal to drive the HID lamp 12, and calculates a second electric characteristic variation of the HID lamp 12. The third driving signal is a power or a current, for example. When the third driving signal is the power, the second electric characteristic variation is a voltage variation or a current variation, for example. When the third driving signal is the current, the second electric characteristic variation is a voltage variation or a power variation, for example. The third driving signal is outputted after the HID lamp 12 enters the steady state, for example.

As shown in the step 225, the control circuit 111 identifies whether the second electric characteristic variation is greater than or equal to a second default value. If yes, the step 223 is performed. As shown in the step 223, the control circuit 111 identifies the HID lamp 12 as a second rated-power lamp. Oppositely, when the second electric characteristic variation is smaller than the second default value, as shown in the step 226, the control circuit 111 identifies the HID lamp 12 as a third rated-power lamp. After the rated power of the HID lamp 12 has been identified, the operation parameters of the ballast 11 can be subsequently adjusted according to the rated power of the HID lamp 12.

The first default value and the second default value can be determined according to several electric characteristic variation ranges of an electric characteristic variation database. In other words, the method for identifying the rated power of the HID lamp may further include the steps of: creating the electric characteristic variation database for recording several electric characteristic variation ranges respectively corresponding to the HID lamps with different rated powers; and determining the first default value and the second default value according to the electric characteristic variation ranges.

First Embodiment

Figure 5:
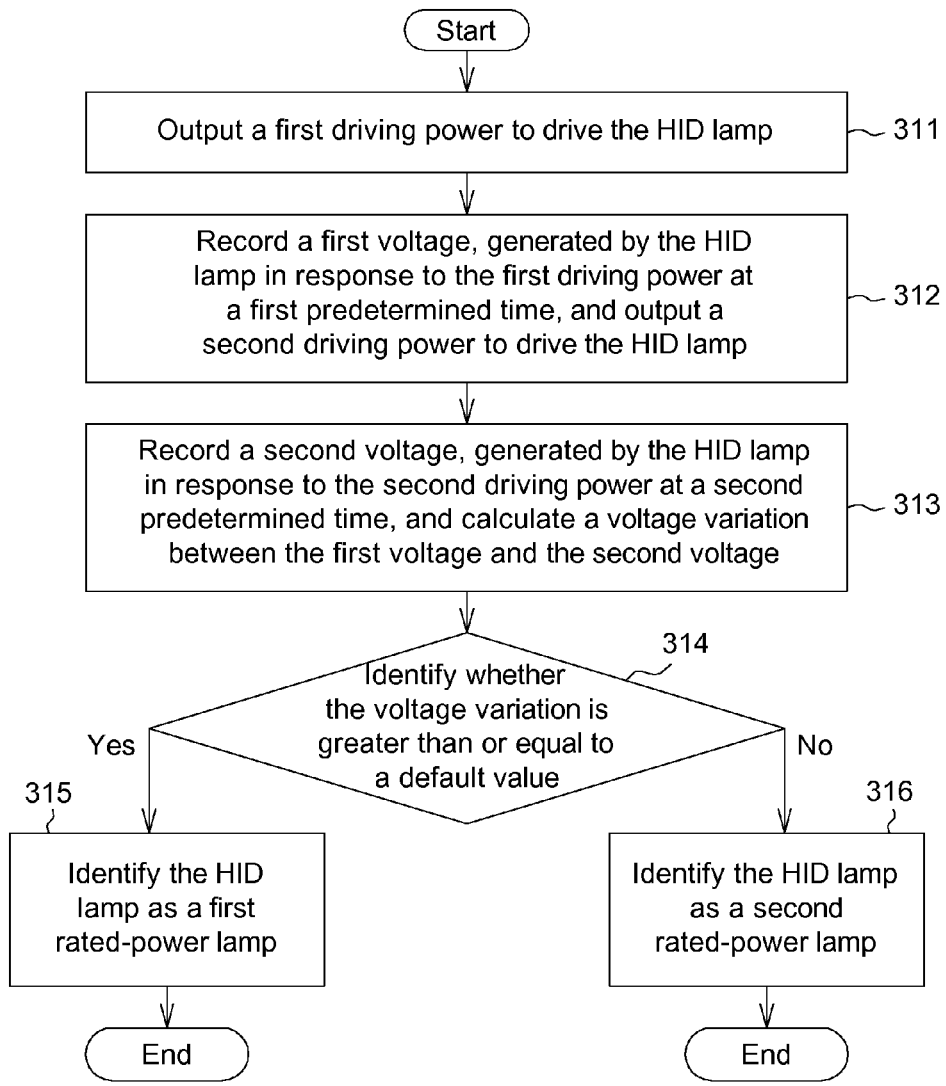
FIG. 5 shows a flow chart of the method for identifying the rated power of the HID lamp according to a first embodiment of FIGS. 2 and 3.
Figure 6:
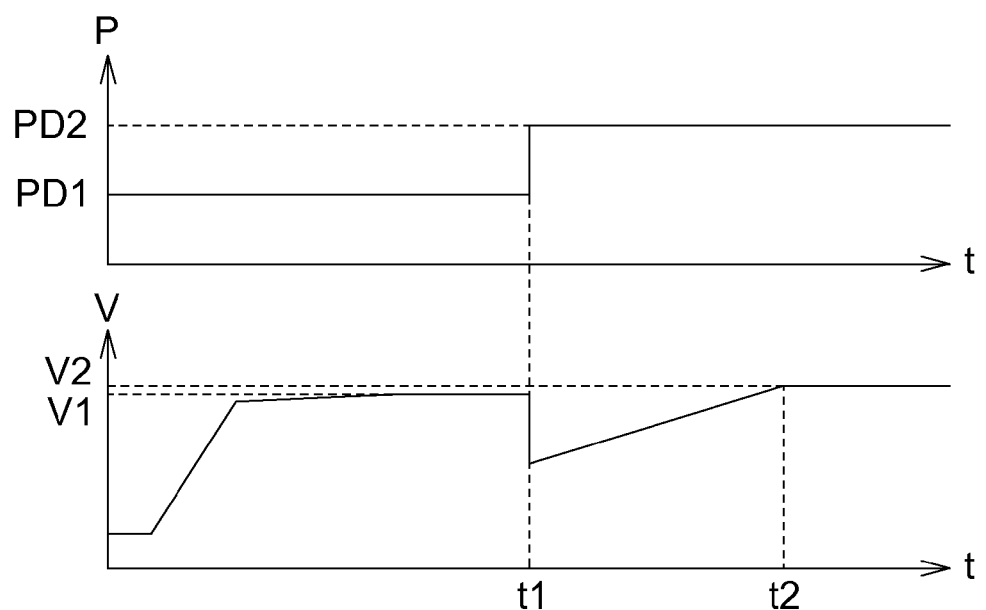
FIG. 6 shows a timing chart of a driving power and a voltage of the HID lamp according to the first embodiment.

Please refer to FIGS. 1, 2, 3, 5 and 6, wherein FIG. 5 shows a flow chart of the method for identifying the rated power of the HID lamp according to the first embodiment of FIGS. 2 and 3, and FIG. 6 shows a timing chart of a driving power and a voltage of the HID lamp according to the first embodiment. In the illustrated first embodiment, the first driving signal and the second driving signal are a first driving power PD1 and a second driving power PD2, respectively, while the first electric characteristic and the second electric characteristic are a first voltage V1 and a second voltage V2, respectively. The first electric characteristic variation and the first default value are a voltage variation DV and a default value DVS, respectively, in the illustrated example.

The method for identifying the rated power of the HID lamp includes the following steps. As shown in step 311, the first driving power PD1 is outputted to drive the HID lamp 12. As shown in step 312, the first voltage V1, generated by the HID lamp 12 in response to the first driving power PD1, is recorded at a first predetermined time t1, and the second driving power PD2 is outputted to drive the HID lamp 12. It is to be noted that the first predetermined time t1 is basically the time after the first driving power PD1 drives the HID lamp 12 to reach the voltage steady state. In the first embodiment, the step 312 firstly records the first voltage V1, generated in response to the first driving power PD1, and then outputs the second driving power PD2 to drive the HID lamp 12. However, the disclosure is not particularly restricted thereto. In another embodiment, after the first driving power PD1 is outputted to drive the HID lamp 12, the second driving power PD2 may also be firstly outputted to drive the HID lamp 12 at a first predetermined time t1, and then the first voltage V1, generated in response to the second driving power PD2, is recorded. That is, in different embodiments, the first voltage V1 may be selectively at the voltage, generated by the HID lamp 12 in response to the first driving power PD1 or the second driving power PD2, at the first predetermined time t1. As shown in step 313, the second voltage V2, generated by the HID lamp 12 in response to the second driving power PD2, is recorded at a second predetermined time t2, and the voltage variation DV between the first voltage V1 and the second voltage V2 is calculated.

As shown in step 314, whether the voltage variation DV is greater than or equal to the default value DVS is identified. If yes, step 315 is performed. As shown in the step 315, when the voltage variation DV is greater than or equal to the default value DVS, the HID lamp 12 is identified as a first rated-power lamp. Oppositely, when the voltage variation DV is smaller than the default value DVS, as shown in step 316, the HID lamp 12 is identified as a second rated-power lamp. After the rated power of the HID lamp 12 has been identified, the operation parameters of the ballast 11 can be subsequently adjusted according to the rated power of the HID lamp 12.

Figure 7:
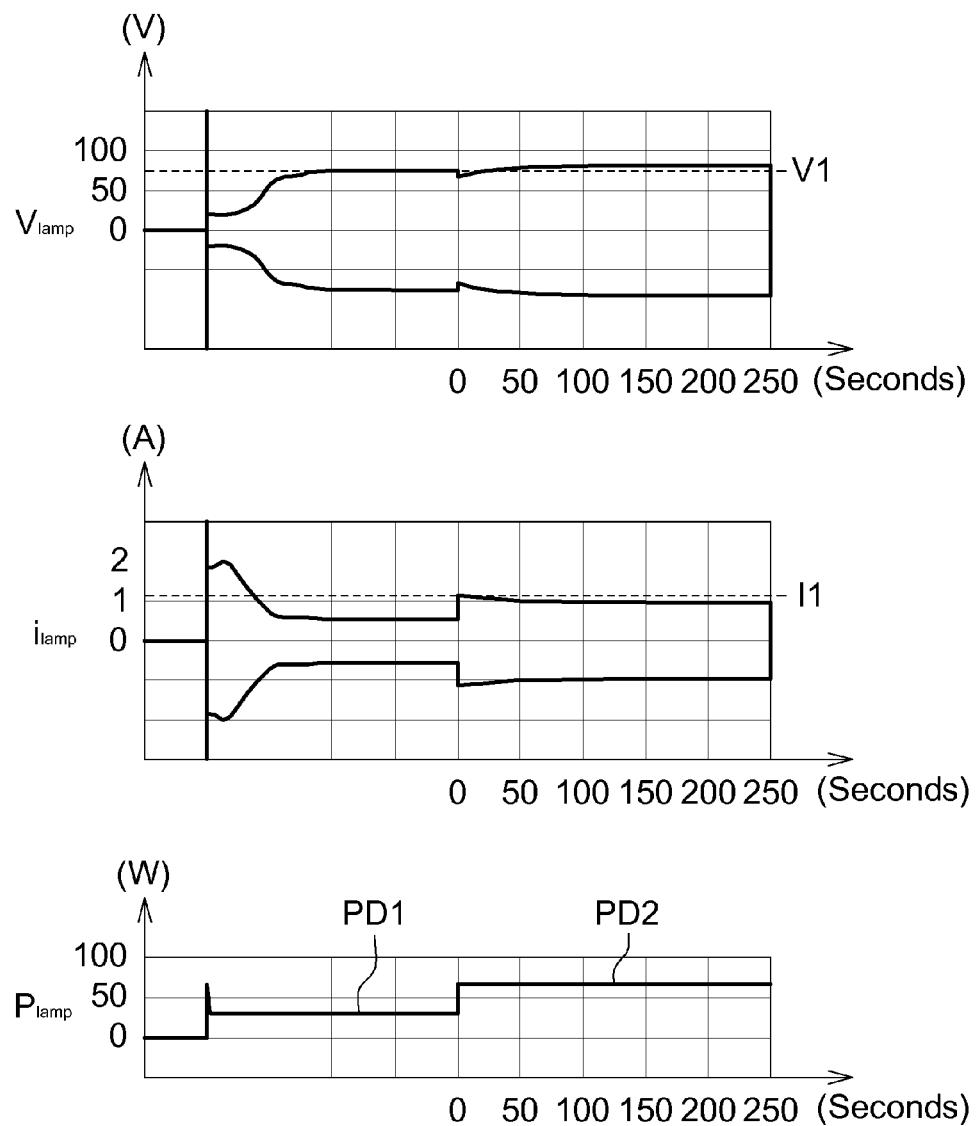
FIG. 7 shows measured waveforms of the GE70W HID lamp.
Figure 8:
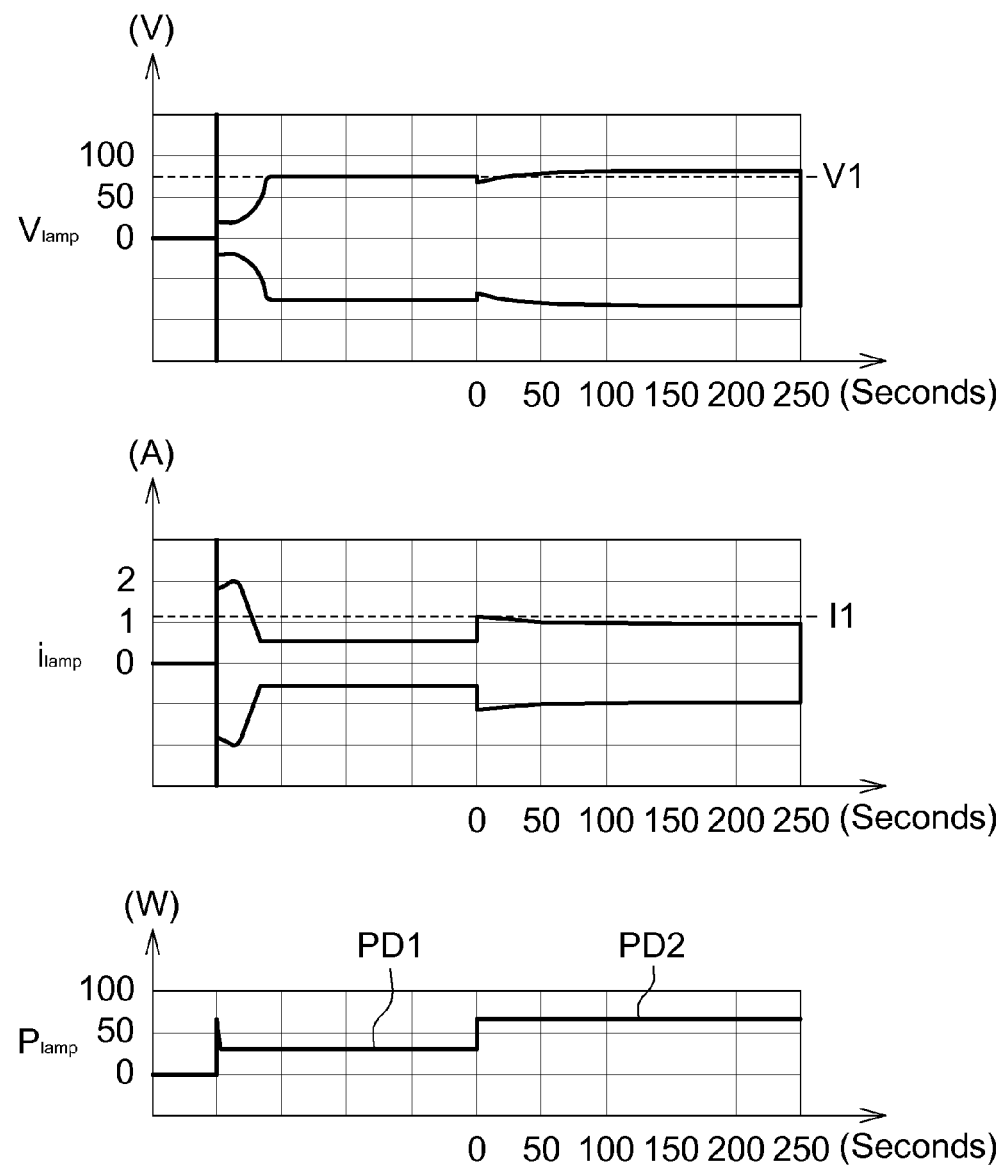
FIG. 8 shows measured waveforms of the OSRAM70W HID lamp.
Figure 9:
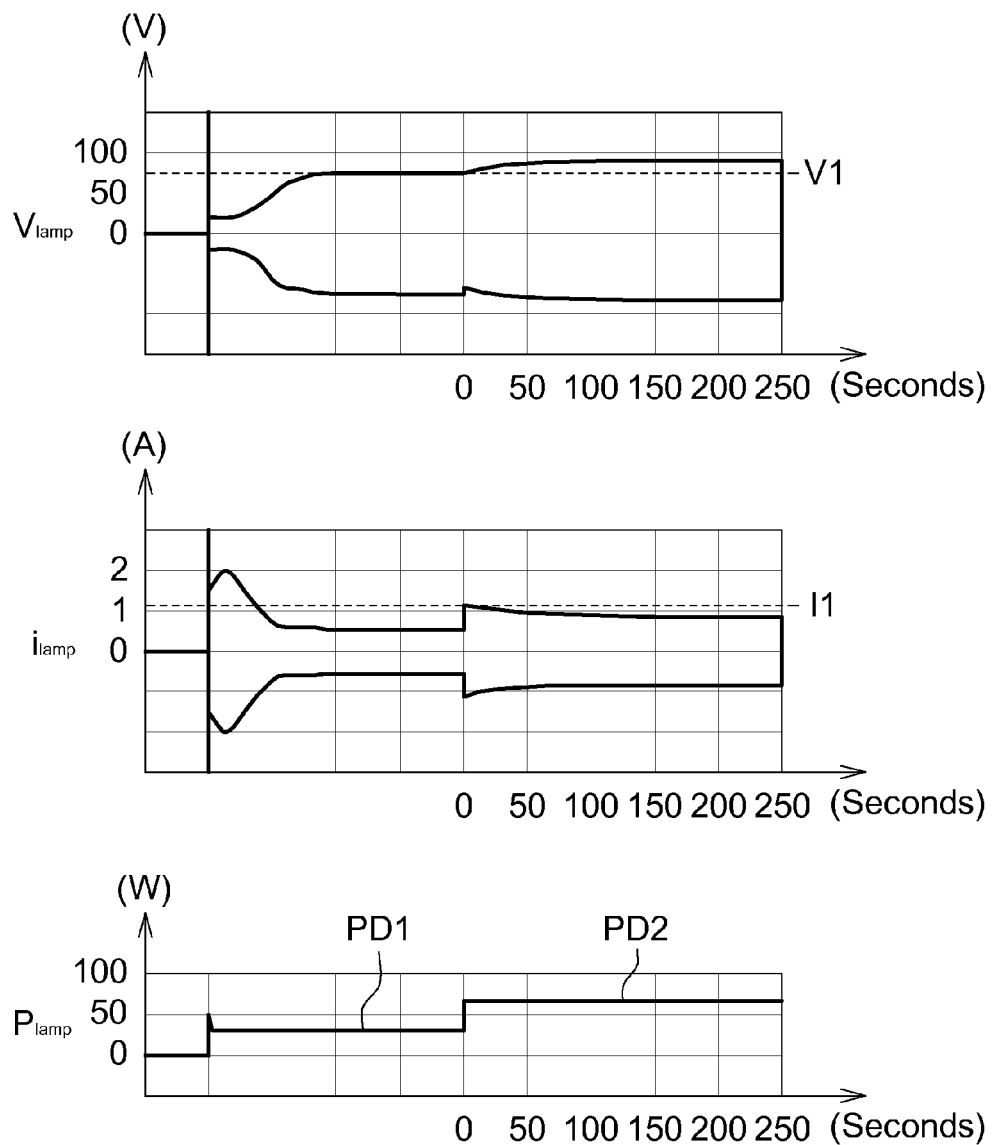
FIG. 9 shows measured waveforms of the PHILIPS70W HID lamp.
Figure 10:
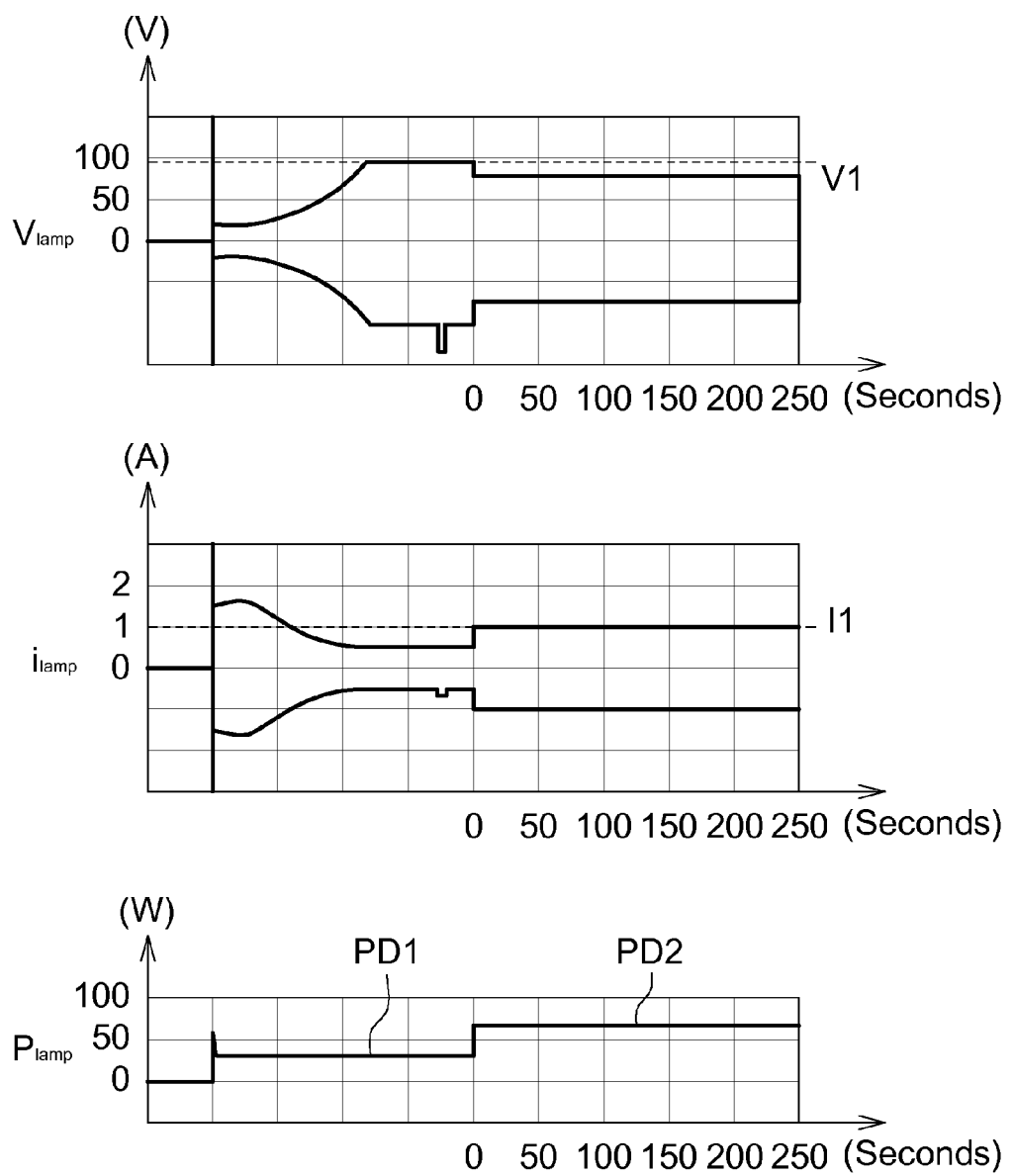
FIG. 10 shows measured waveforms of the GE150W HID lamp.
Figure 11:
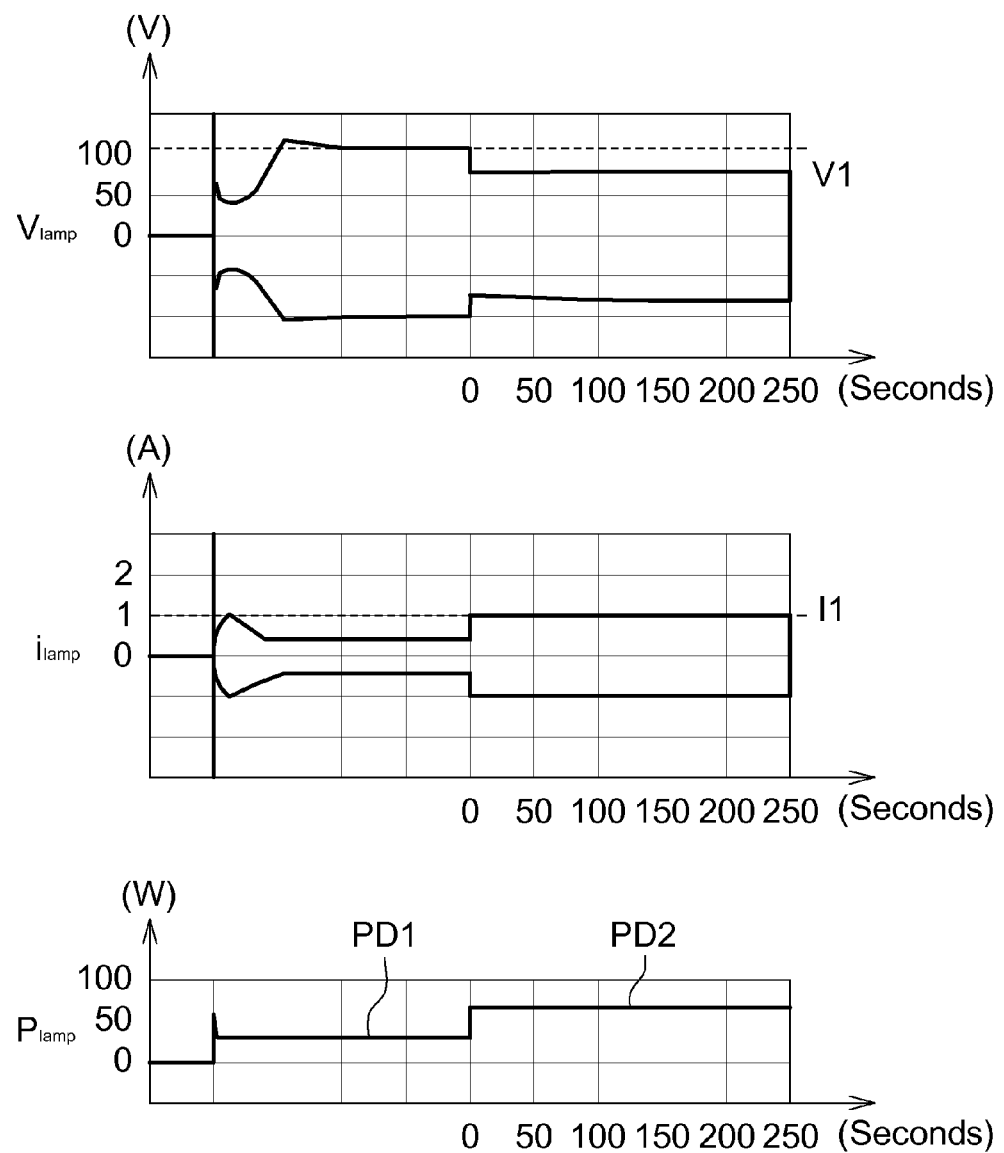
FIG. 11 shows measured waveforms of the OSRAM150W HID lamp.
Figure 12:
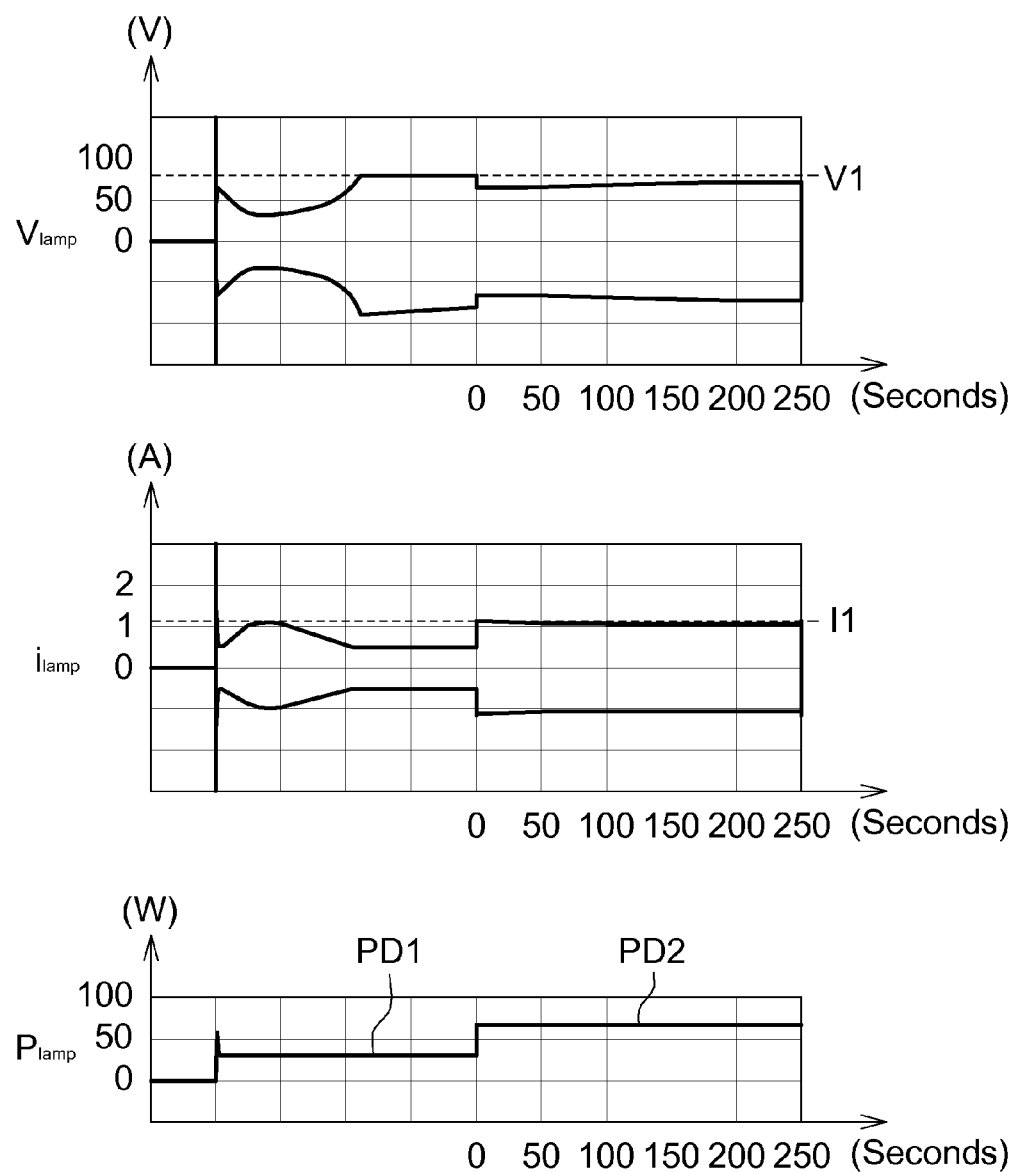
FIG. 12 shows measured waveforms of the PHILIPS150W HID lamp.

Please refer to FIGS. 7 to 13, wherein FIG. 7 shows measured waveforms of the GE70W HID lamp, FIG. 8 shows measured waveforms of the OSRAM70W HID lamp, FIG. 9 shows measured waveforms of the PHILIPS70W HID lamp, FIG. 10 shows measured waveforms of the GE150W HID lamp, FIG. 11 shows measured waveforms of the OSRAM150W HID lamp, FIG. 12 shows measured waveforms of the PHILIPS150W HID lamp, and FIG. 13 shows a list of the voltages and the times of the GE70W, OSRAM70W, PHILIPS70W, GE150W, OSRAM150W and PHILIPS150W HID lamps. As shown in FIGS. 7 to 12, it is obtained that the HID lamps with different rated powers correspond to different electric characteristic variation ranges. The list of FIG. 13 may be further obtained by processing the measured waveforms in FIGS. 7 to 12. The first voltage V1 labeled in FIG. 13 is generated by the HID lamp at the first predetermined time in response to the first driving power PD1. The voltage Vt represents the voltage, generated by the HID lamp in response to the second driving power PD2 after the first driving power PD1 is changed to the second driving power PD2 and after t seconds have elapsed.

The first voltage V1 of the GE70W HID lamp is 76.4V. The voltage Vt, generated by the GE70W HID lamp in response to the second driving power PD2 after the first driving power PD1 is changed to the second driving power PD2 and after 50 seconds have elapsed, is 76.9V. The first voltage V1 of the OSRAM70W HID lamp is 69.1V. The voltage Vt, generated by the OSRAM70W HID lamp 12 in response to the second driving power PD2 after the first driving power PD1 is changed to the second driving power PD2 and after 10 seconds have elapsed, is 69.7V. The first voltage V1 of the PHILIPS70W HID lamp is 70.6V. The voltage Vt, generated by the PHILIPS70W HID lamp 12 in response to the second driving power PD2 after the first driving power PD1 is changed to the second driving power PD2 and after 40 seconds has elapsed, is equal to 71.6V.

The first voltage V1 of the GE150W HID lamp is 92.9V. The voltage Vt, generated by the GE150W HID lamp in response to the second driving power PD2 after the first driving power PD1 is changed to the second driving power PD2 and after 250 seconds have elapsed, is 78.5V. The first voltage V1 of the OSRAM150W HID lamp is 109.1V. The voltage Vt, generated by the OSRAM150W HID lamp 12 in response to the second driving power PD2 after the first driving power PD1 is changed to the second driving power PD2 and after 250 seconds have elapsed, is 83.7V. The first voltage V1 of the PHILIPS150W HID lamp is 76.9V. The voltage Vt, generated by the PHILIPS150W HID lamp 12 in response to the second driving power PD2 after the first driving power PD1 is changed to the second driving power PD2 and after 250 seconds has elapsed, is 67.2V.

As shown in FIG. 13, the time for the lamp voltage $V_{lamp}$ to return to the first voltage V1 is shorter than 50 seconds for the HID lamp with the rated power of 70W, and the time for the lamp voltage $V_{lamp}$ to return to the first voltage V1 is longer than 250 seconds for the HID lamp with the rated power of 150W. Therefore, the time after the first driving power PD1 is changed to the second driving power PD2 and after 100 seconds have elapsed is set as the second predetermined time. At this time, the lamp voltage $V_{lamp}$ is set as the second voltage V2, and the voltage variation DV=V2−V1. For the HID lamp with the rated power of 70W, its voltage variation DV is greater than or equal to 0. For the HID lamp with the rated power of 150W, its voltage variation DV is smaller than 0. That is, the electric characteristic variation range for the 70W HID lamp is greater than or equal to 0, while the electric characteristic variation range for the 150W HID lamp is smaller than 0.

When the rated power of the HID lamp is identified as 70W or 150W, the default value DVS can be set to 0. When the voltage variation DV is greater than or equal to 0, the rated power of the HID lamp is identified as 70W. Oppositely, when the voltage variation DV is smaller than 0, the rated power of the HID lamp is identified as 150W.

Second Embodiment

Figure 14:
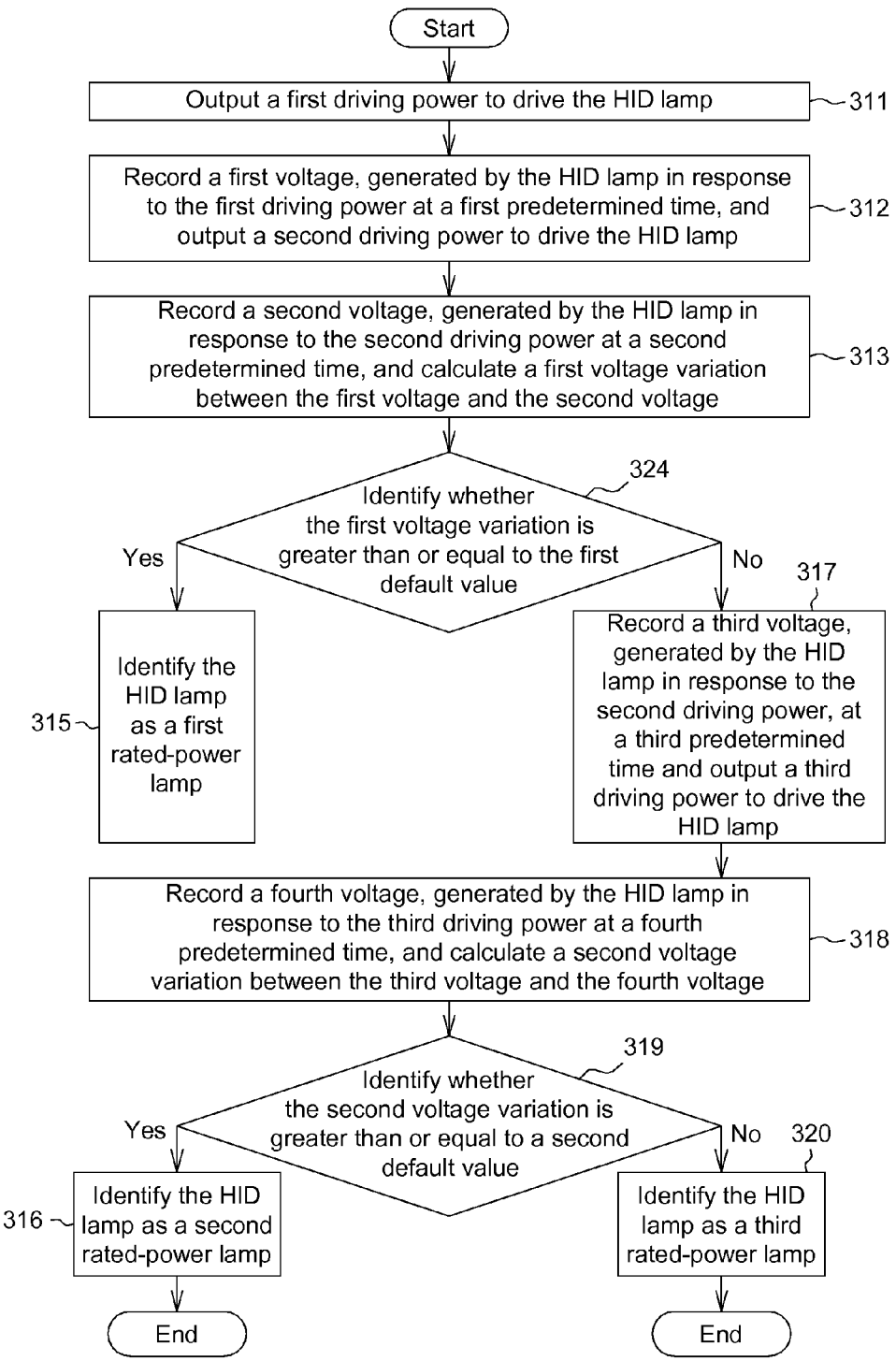
FIG. 14 shows a flow chart of a method for identifying a rated power of a HID lamp according to a second embodiment of FIGS. 2 and 4.

Please refer to FIGS. 2, 4 and 14, wherein FIG. 14 shows a flow chart of a method for identifying a rated power of a HID lamp according to a second embodiment of FIGS. 2 and 4. As shown in FIG. 14, the HID lamp 12 generates a third electric characteristic and a fourth electric characteristic at a third predetermined time and a fourth predetermined time, respectively. In the second embodiment, the first driving signal, the second driving signal and the third driving signal are a first driving power, a second driving power and a third driving power, respectively, and the first electric characteristic, the second electric characteristic, the third electric characteristic and the fourth electric characteristic are a first voltage, a second voltage, a third voltage and a fourth voltage, respectively. The first electric characteristic variation and the second electric characteristic variation are a first voltage variation and a second voltage variation, respectively, in the illustrated example.

The method for identifying the rated power of the HID lamp includes the following steps. As shown in step 311, a first driving power is outputted to drive the HID lamp. As shown in step 312, a first voltage, generated by the HID lamp in response to the first driving power, is recorded at the first predetermined time, and a second driving power is outputted to drive the HID lamp. It is to be noted that the selected first predetermined time is basically the time after the first driving power drives the HID lamp to reach the voltage steady state. In the second embodiment, the step 312 first records the first voltage, generated in response to the first driving power, and then outputs the second driving power to drive the HID lamp. However, the disclosure is not particularly restricted thereto. In another embodiment, the step 312 may also firstly output the second driving power to drive the HID lamp, and then record the first voltage generated in response to the second driving power. As shown in step 313, a second voltage, generated by the HID lamp in response to the second driving power, is recorded at the second predetermined time, and a first voltage variation between the first voltage and the second voltage is calculated.

As shown in step 324, it is identified whether the first voltage variation is greater than or equal to the first default value. If yes, step 315 is performed. As shown in the step 315, when the first voltage variation is greater than or equal to the first default value, the HID lamp is identified as a first rated-power lamp. Oppositely, when the first voltage variation is smaller than the first default value, step 317 is performed. As shown in the step 317, when the first voltage variation is smaller than the first default value, a third voltage, generated by the HID lamp in response to the second driving power, is recorded at the third predetermined time, and a third driving power is outputted to drive the HID lamp. It is to be noted that the selected third predetermined time is basically the time after the second driving power drives the HID lamp to reach the voltage steady state. In the second embodiment, the step 317 firstly records the third voltage, generated in response to the second driving power, and then outputs the third driving power to drive the HID lamp. However, this disclosure is not particularly restricted thereto. In another embodiment, the step 317 may firstly output the third driving power to drive the HID lamp, and then record the third voltage generated in response to the third driving power. As shown in step 318, the fourth voltage, generated by the HID lamp in response to the third driving power, is recorded at the fourth predetermined time, and a second voltage variation between the third voltage and the fourth voltage is calculated.

As shown in step 319, it is identified whether the second voltage variation is greater than or equal to the second default value. If yes, step 316 is performed. As shown in the step 316, the HID lamp is identified as a second rated-power lamp. Oppositely, when the second voltage variation is smaller than the second default value, as shown in step 320, the HID lamp is identified as a third rated-power lamp. After the rated power of the HID lamp has been identified, the operation parameters of the ballast can be subsequently adjusted according to the rated power of the HID lamp. The first default value and the second default value may be determined according to several electric characteristic variation ranges of the electric characteristic variation database, as mentioned hereinabove, and detailed descriptions thereof will be omitted.

Third Embodiment

Figure 15:
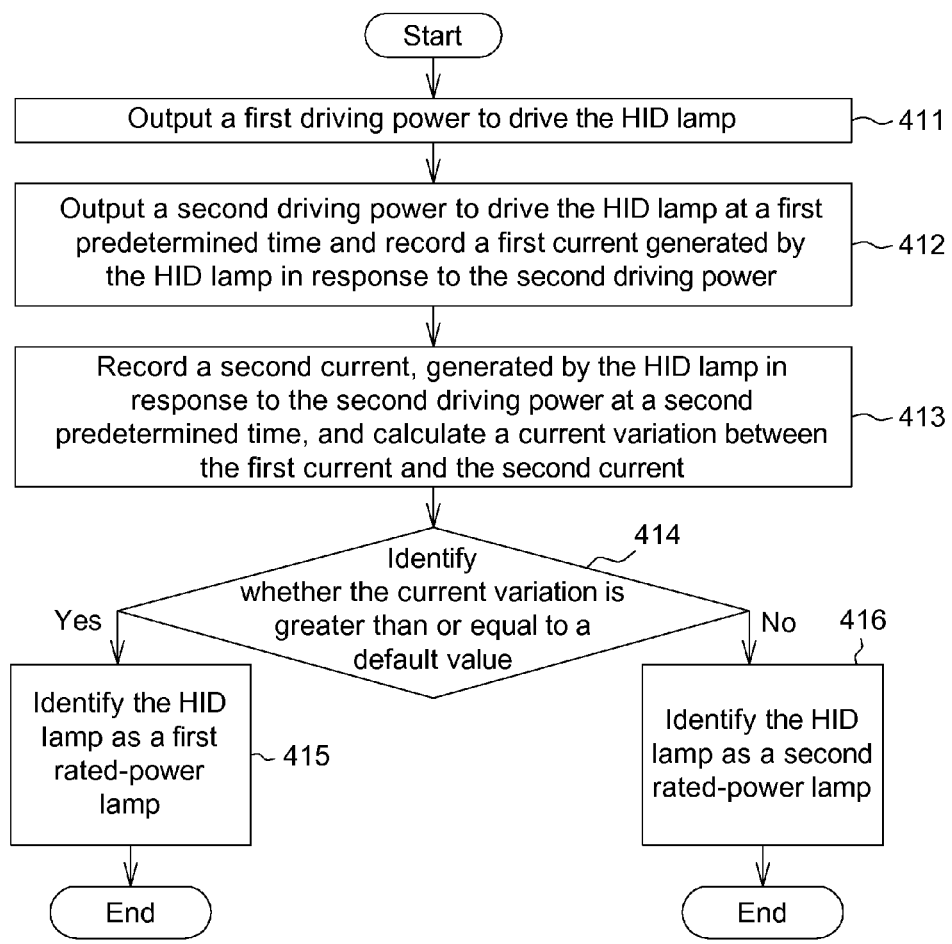
FIG. 15 shows a flow chart of a method for identifying a rated power of a HID lamp according to a third embodiment of FIGS. 2 and 3.

Please refer to FIGS. 2, 3 and 15, wherein FIG. 15 shows a flow chart of a method for identifying a rated power of a HID lamp according to a third embodiment of FIGS. 2 and 3. In the third embodiment, the first driving signal and the second driving signal are the first driving power and the second driving power, respectively, and the first electric characteristic and the second electric characteristic are the first current and the second current, respectively. In the illustrated example, the first electric characteristic variation and the first default value are a current variation and a default value, respectively.

The method for identifying the rated power of the HID lamp includes the following steps. As shown in step 411, a first driving power is outputted to drive the HID lamp. As shown in step 412, a second driving power is outputted to drive the HID lamp at a first predetermined time, and a first current, generated by the HID lamp in response to the second driving power, is generated. It is to be noted that the selected first predetermined time is basically the time after the first driving power drives the HID lamp to reach the voltage steady state. As shown in step 413, a second current, generated by the HID lamp in response to the second driving power, is recorded at a second predetermined time, and a current variation between the first current and the second current is calculated.

As shown in step 414, it is identified whether the current variation is greater than or equal to the default value. If yes, step 415 is performed. As shown in the step 415, when the current variation is greater than or equal to the default value, the HID lamp is identified as a first rated-power lamp. Oppositely, when the current variation is smaller than the default value, as shown in step 416, the HID lamp is identified as a second rated-power lamp. After the rated power of the HID lamp has been identified, the operation parameters of the ballast can be subsequently adjusted according to the rated power of the HID lamp.

Please refer to FIGS. 7 to 12 and 16, wherein FIG. 16 shows a list of currents and times of the GE70W, OSRAM70W, PHILIPS70W, GE150W, OSRAM150W and PHILIPS150W HID lamps. As shown in FIGS. 7 to 12, it is obtained that the HID lamps with different rated powers correspond to different electric characteristic variation ranges, and the list shown in FIG. 16 may be further obtained according to the measured waveforms of FIGS. 7 to 12. The first current I1 is the first current generated by the HID lamp 12 at the first predetermined time in response to the second driving power PD2. The current It represents the current generated by the HID lamp 12 in response to the second driving power PD2 after being driven by the second driving power for t seconds.

The first current I1 of the GE70W HID lamp is 1.124 A. The current It, generated by the GE70W HID lamp in response to the second driving power PD2 after the second driving power PD2 drives the GE70W HID lamp for 30 seconds, is 0.983 A. The first current I1 of the OSRAM70W HID lamp is 1.227 A. The current It, generated by the OSRAM70W HID lamp in response to the second driving power PD2 after the second driving power PD2 drives the OSRAM70W HID lamp for 10 seconds, is 1.124 A. The first current I1 of the PHILIPS70W HID lamp is 1.048 A. The current It, generated by the PHILIPS70W HID lamp in response to the second driving power PD2 after the second driving power PD2 drives the PHILIPS70W HID lamp for 35 seconds, is 0.94 A.

The first current I1 of the GE150W HID lamp is 0.946 A. The current It, generated by the GE150W HID lamp in response to the second driving power PD2 after the second driving power PD2 drives the GE150W HID lamp for 250 seconds, is 0.968 A. The first current I1 of the OSRAM150W HID lamp is 0.962 A. The current It, generated by the OSRAM150W HID lamp in response to the second driving power PD2 after the second driving power drives the OSRAM150W HID lamp for 250 seconds, is 0.961 A. The first current I1 of the PHILIPS150W HID lamp is 1.187 A. The current It, generated by the PHILIPS150W HID lamp in response to the second driving power PD2 after the second driving power PD2 drives the PHILIPS150W HID lamp for 150 seconds, is 1.047 A.

As shown in FIG. 16, for the HID lamp with the rated power of 70W, the current variation between its first current I1 and the current It is greater than 0.1 A within 35 seconds. For the HID lamp with the rated power of 150W, the current variation between its first current I1 and the current It cannot be greater than 0.1 A until 150 seconds have elapsed. Thus, the time that is 100 seconds after the time when the first driving power PD1 is changed to the second driving power PD2 is set as the second predetermined time. At this time, the lamp current $I_{lamp}$ is set as the second current I2, and the current variation DI=I1−I2. For the HID lamp with the rated power of 70W, its current variation DI is greater than or equal to 0.1 A. For the HID lamp with the rated power of 150W, its current variation DI is smaller than 0.1 A. That is, the electric characteristic variation range of the 70W HID lamp is greater than or equal to 0.1 A, while the electric characteristic variation range of the 150W HID lamp is smaller than 0.1 A.

When the rated power of the HID lamp is identified as 70W or 150W, the default value may be set as 0.1 A. When the current variation DI is greater than or equal to 0.1 A, the rated power of the HID lamp is identified as 70W. Oppositely, when the current variation DI is smaller than 0.1 A, the rated power of the HID lamp is identified as 150W.

It is to be stated that the steps of FIG. 15 of recording the first and second currents and calculating the current variation may also be replaced with the steps of recording the first voltage, generated by the HID lamp in response to the second driving power at the first predetermined time, recording the second voltage, generated by the HID lamp in response to the second driving power at the second predetermined time, and calculating a voltage variation between the first voltage and the second voltage. The rated power of the HID lamp is identified by identifying whether the voltage variation is greater than or equal to the default value, and detailed steps thereof will be omitted.

Fourth Embodiment

Figure 17:
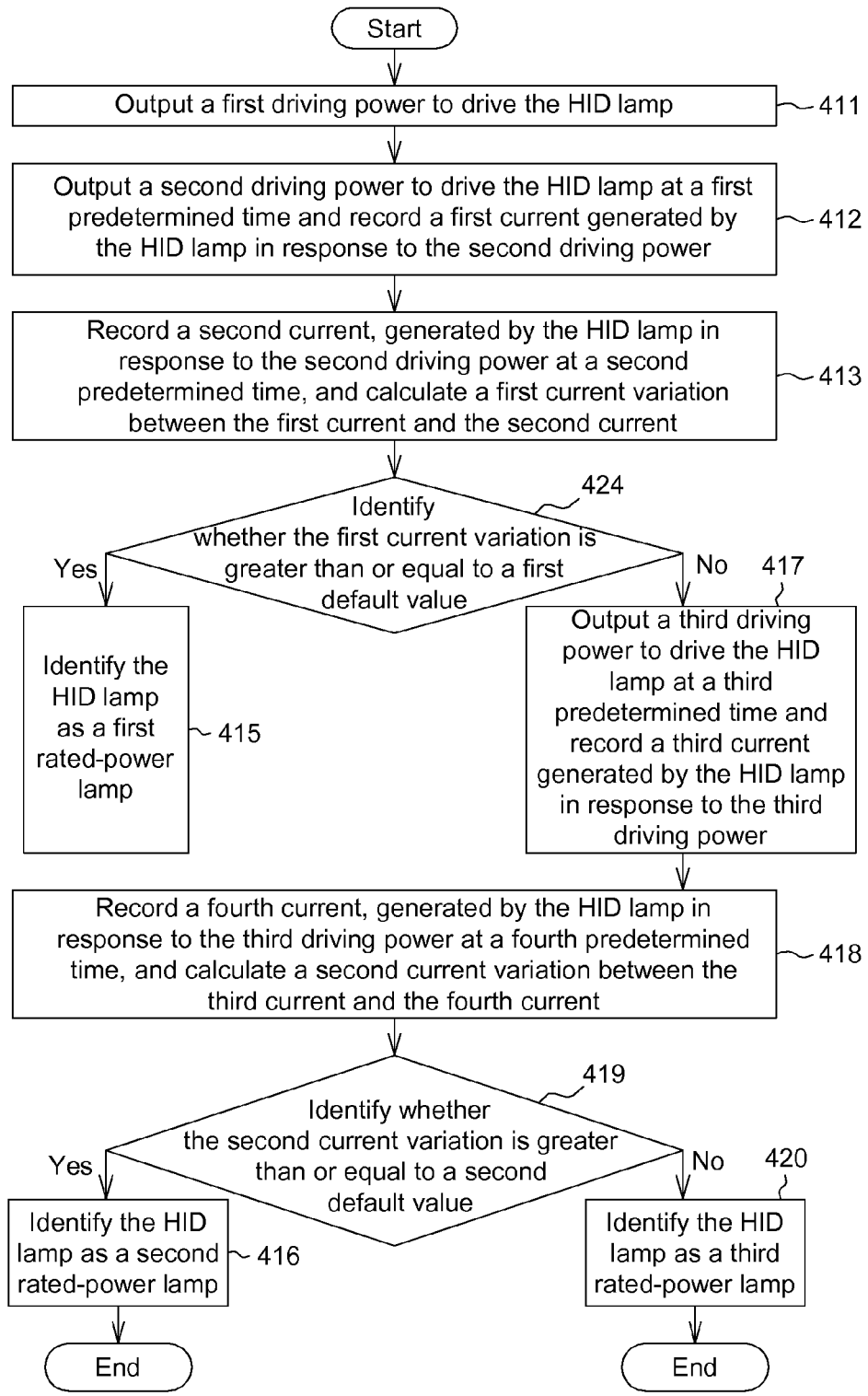
FIG. 17 shows a flow chart of a method for identifying a rated power of a HID lamp according to a fourth embodiment of FIGS. 2 and 4.

Please refer to FIGS. 2, 4 and 17, wherein FIG. 17 shows a flow chart of a method for identifying a rated power of a HID lamp according to a fourth embodiment of FIGS. 2 and 4. The HID lamp 12 generates the third electric characteristic and the fourth electric characteristic at the third predetermined time and the fourth predetermined time, respectively. In the fourth embodiment, the first driving signal, the second driving signal and the third driving signal are the first driving power, the second driving power and the third driving power, respectively, and the first electric characteristic, the second electric characteristic, the third electric characteristic and the fourth electric characteristic are the first current, the second current, the third current and the fourth current, respectively. The first electric characteristic variation and the second electric characteristic variation are the first current variation and the second current variation, respectively, in the illustrated example.

The method for identifying the rated power of the HID lamp includes the following steps. As shown in step 411, the first driving power is outputted to drive the HID lamp. As shown in step 412, the second driving power is outputted to drive the HID lamp at a first predetermined time, and the first current, generated by the HID lamp in response to the second driving power, is recorded. It is to be noted that the selected first predetermined time is basically the time after the first driving power drives the HID lamp to reach the voltage steady state. As shown in step 413, the second current, generated by the HID lamp in response to the second driving power, is recorded at the second predetermined time, and the first current variation between the first current and the second current is calculated.

As shown in step 424, it is identified whether the first current variation is greater than or equal to the first default value. If yes, step 415 is performed. As shown in the step 415, when the first current variation is greater than or equal to the first default value, the HID lamp is identified as a first rated-power lamp. Oppositely, when the first current variation is smaller than the first default value, step 417 is performed. As shown in the step 417, when the first current variation is smaller than the first default value, the third driving power is outputted to drive the HID lamp at the third predetermined time, and the third current, generated by the HID lamp in response to the third driving power, is recorded. It is to be noted that the selected third predetermined time is basically the time after the second driving power drives the HID lamp to reach the voltage steady state. As shown in step 418, the fourth current, generated by the HID lamp in response to the third driving power, is recorded at the fourth predetermined time, and the second current variation between the third current and the fourth current is calculated.

As shown in step 419, it is identified whether the second current variation is greater than or equal to a second default value. If yes, step 416 is performed. As shown in the step 416, the HID lamp is identified as a second rated-power lamp. Oppositely, when the second current variation is smaller than the second default value, as shown in step 420, the HID lamp is identified as the third rated-power lamp. After the rated power of the HID lamp has been identified, the operation parameters of the ballast can be subsequently adjusted according to the rated power of the HID lamp. As mentioned hereinabove, the first default value and the second default value may be determined according to several electric characteristic variation ranges of the electric characteristic variation database, and detailed descriptions thereof will be omitted.

It is to be stated that the steps of FIG. 17 of recording the first, second, third and fourth currents and calculating the first and second current variation may also be replaced with the steps of recording the first voltage, generated by the HID lamp in response to the second driving power at the first predetermined time, recording the second voltage, generated by the HID lamp in response to the second driving power at the second predetermined time, recording the third voltage, generated by the HID lamp in response to the third driving power at the third predetermined time, recording the third voltage, generated by the HID lamp in response to the third driving power at the fourth predetermined time, and calculating the first and second voltage variation between the first voltage and the second voltage and between the third voltage and the fourth voltage. In addition, the rated power of the HID lamp is identified by identifying whether the first and second voltage variation are greater than or equal to the first and second default values, and detailed steps thereof will be omitted.

Fifth Embodiment

Figure 18:
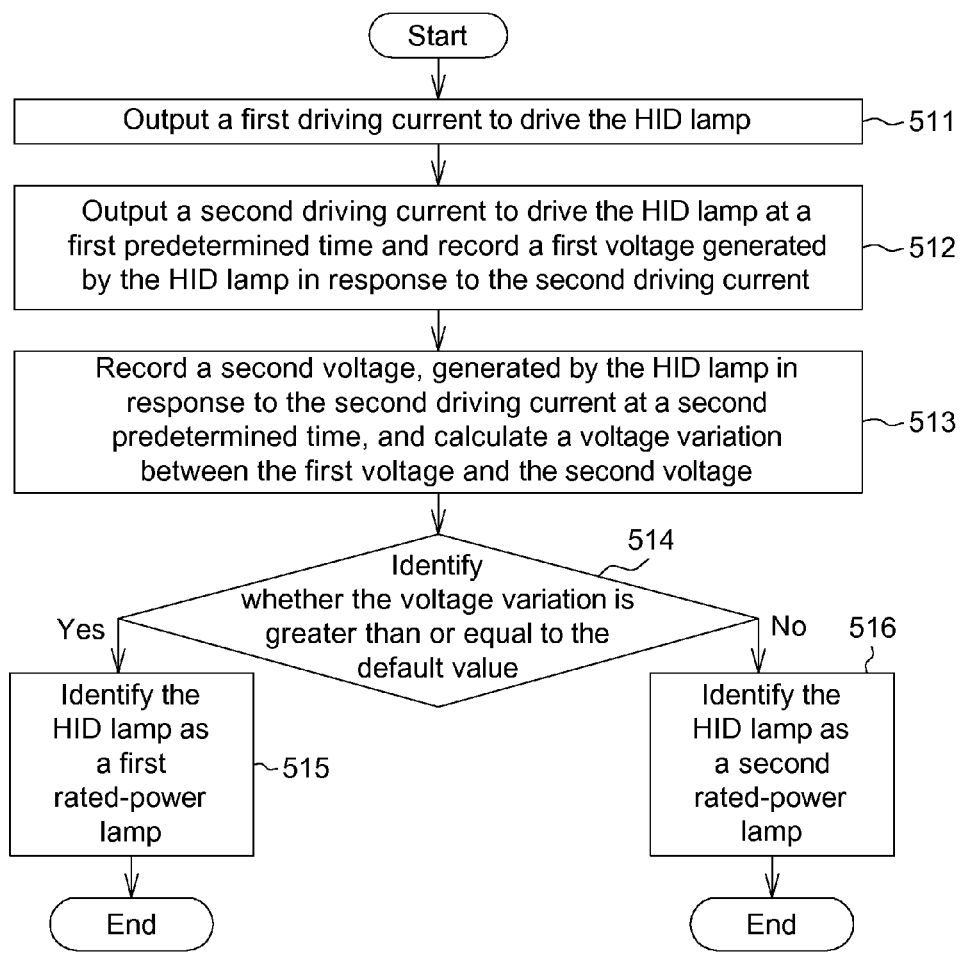
FIG. 18 shows a flow chart of a method for identifying a rated power of a HID lamp according to a fifth embodiment of FIGS. 2 and 3.

Please refer to FIGS. 2, 3 and 18, wherein FIG. 18 shows a flow chart of a method for identifying a rated power of a HID lamp according to a fifth embodiment of FIGS. 2 and 3. In the fifth embodiment, the first driving signal and the second driving signal are the first driving current and the second driving current, respectively, and the first electric characteristic and the second electric characteristic are the first voltage and the second voltage, respectively. The first electric characteristic variation and the first default value are the voltage variation and the default value, respectively, in the illustrated example.

The method for identifying the rated power of the HID lamp includes the following steps. As shown in step 511, the first driving current is outputted to drive the HID lamp. As shown in step 512, the second driving current is outputted to drive the HID lamp at a first predetermined time, and the first voltage, generated by the HID lamp in response to the second driving current, is recorded. It is to be noted that the selected first predetermined time is basically the time after the first driving current drives the HID lamp to reach the voltage steady state. As shown in step 513, the second voltage, generated by the HID lamp in response to the second driving current, is recorded at the second predetermined time, and a voltage variation between the first voltage and the second voltage is calculated.

As shown in step 514, it is identified whether the voltage variation is greater than or equal to the default value. If yes, step 515 is performed. As shown in the step 515, when the voltage variation is greater than or equal to the default value, the HID lamp is identified as a first rated-power lamp. Oppositely, when the voltage variation is smaller than the default value, as shown in step 516, the HID lamp is identified as a second rated-power lamp. After the rated power of the HID lamp has been identified, the operation parameters of the ballast can be subsequently adjusted according to the rated power of the HID lamp.

Figure 19:
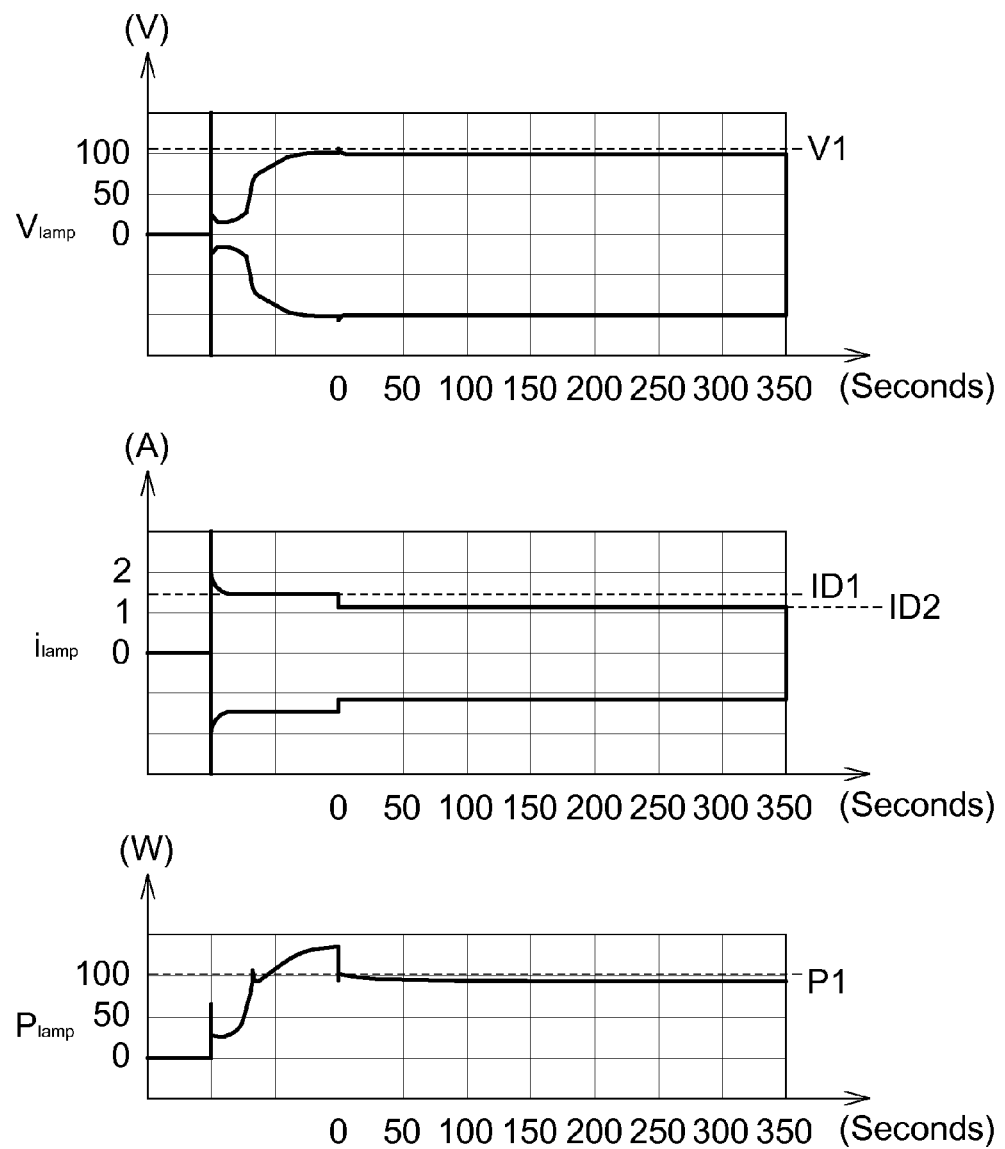
FIG. 19 shows measured waveforms of the 70W HID lamp driven by the constant current.
Figure 20:
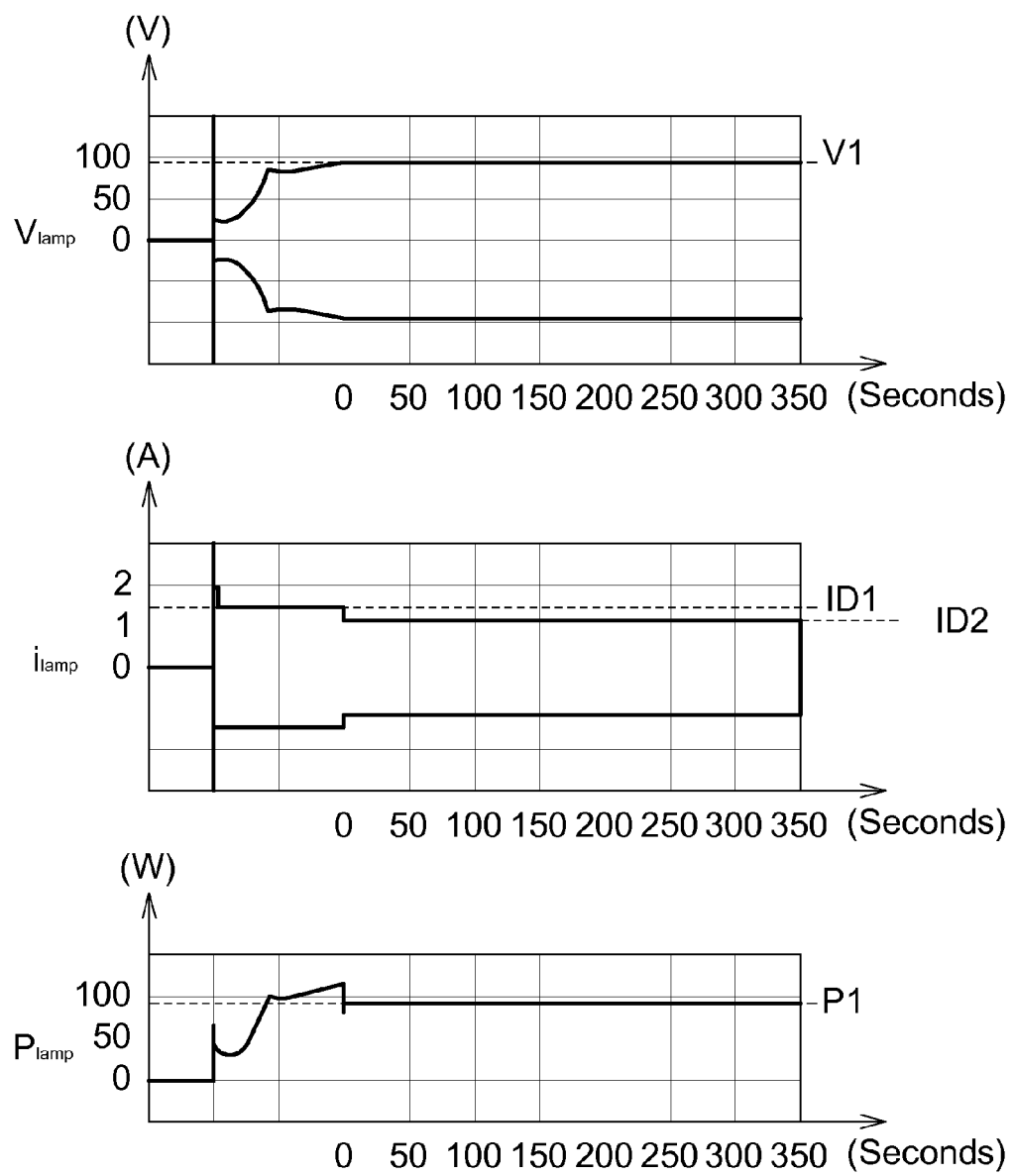
FIG. 20 shows measured waveforms of the 150W HID lamp driven by the constant current.
Figure 21:
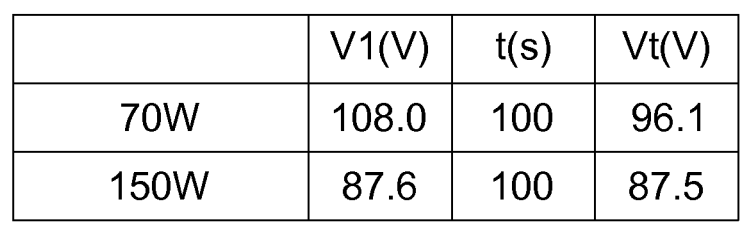

Please refer to FIGS. 19 to 21, wherein FIG. 19 shows measured waveforms of the 70W HID lamp driven by the constant current, FIG. 20 shows measured waveforms of the 150W HID lamp driven by the constant current, and FIG. 21 shows a list of voltages and times for driving the 70W and 150W HID lamps with the constant current. As shown in FIGS. 19 and 20, it is obtained that the HID lamps with different rated powers correspond to different electric characteristic variation ranges, and the list shown in FIG. 21 can be further obtained according to the measured waveforms of FIGS. 19 and 20. The first voltage V1 is generated by the HID lamp 12 at the first predetermined time in response to the second driving current ID2. The voltage Vt is the voltage generated by the HID lamp 12 in response to the second driving current ID2 after the second driving current drives the HID lamp 12 for t seconds.

The first voltage V1 of the 70W HID lamp is 108V. The voltage Vt, generated by the 70W HID lamp 12 in response to the second driving current ID2 after the second driving current drives the HID lamp 12 for 100 seconds, is 96.1V. The first voltage V1 of the 150W HID lamp is 87.6V. The voltage Vt, generated by the 150W HID lamp 12 in response to the second driving current ID2 after the second driving current drives the HID lamp 12 for 100 seconds, is 87.5V.

As shown in FIG. 21, it is obtained that the voltage variation between the first voltage V1 and the voltage Vt in the HID lamp with the rated power of 70W within 100 seconds is greater than 11V. For the HID lamp with the rated power of 150W, the voltage variation between its first voltage V1 and the voltage Vt is 0.1V. Thus, the time that is 100 seconds after the second driving current drives the lamp is set as the second predetermined time. At this time, the lamp voltage $V_{lamp}$ is set as the second voltage V2, and the voltage variation DV=V1−V2. For the HID lamp with the rated power of 70W, its voltage variation DV is greater than or equal to 11V. For the HID lamp with the rated power of 150W, its voltage variation DV is smaller than 11V. That is the electric characteristic variation range of the 70W HID lamp is greater than or equal to 11V, and the electric characteristic variation range of the 150W HID lamp is smaller than 11V.

When the rated power of the HID lamp is identified as 70W or 150W, the default value may be set as 11V. When the voltage variation DV is greater than or equal to 11V, the rated power of the HID lamp is identified as 70W. Oppositely, when the voltage variation DV is smaller than 11V, the rated power of the HID lamp is identified as 150W.

Sixth Embodiment

Figure 22:
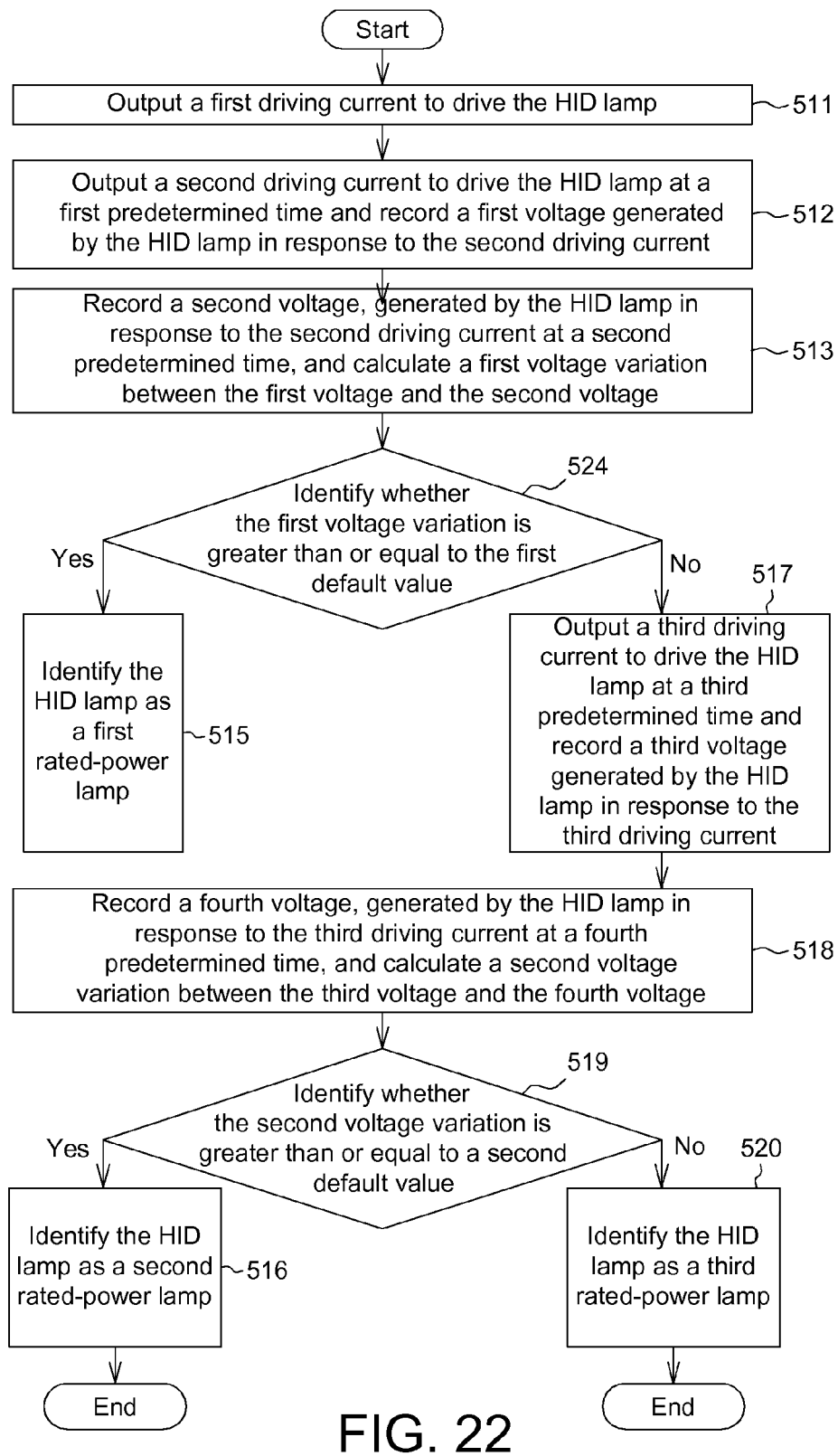
FIG. 22 shows a flow chart of a method for identifying a rated power of a HID lamp according to a sixth embodiment of FIGS. 2 and 4.

Please refer to FIGS. 2, 4 and 22, wherein FIG. 22 shows a flow chart of a method for identifying a rated power of a HID lamp according to a sixth embodiment of FIGS. 2 and 4. The HID lamp 12 generates the third electric characteristic and the fourth electric characteristic at the third predetermined time and the fourth predetermined time, respectively. In the illustrated sixth embodiment, the first driving signal, the second driving signal and the third driving signal are the first driving current, the second driving current and the third driving current, and the first electric characteristic, the second electric characteristic, the third electric characteristic and the fourth electric characteristic are the first voltage, the second voltage, the third voltage and the fourth voltage, respectively. The first electric characteristic variation and the second electric characteristic variation are the first voltage variation and the second voltage variation, respectively, in this illustrated example.

The method for identifying the rated power of the HID lamp includes the following steps. As shown in step 511, the first driving current is outputted to drive the HID lamp. As shown in step 512, the second driving current is outputted to drive the HID lamp at a first predetermined time, and the first voltage, generated by the HID lamp in response to the second driving current, is recorded. It is to be noted that the selected first predetermined time is basically the time after the first driving current drives the HID lamp to reach the voltage steady state. As shown in step 513, the second voltage, generated by the HID lamp in response to the second driving current, is recorded at the second predetermined time, and the first voltage variation between the first voltage and the second voltage is calculated.

As shown in step 524, it is identified whether the first voltage variation is greater than or equal to the first default value. If yes, step 515 is performed. As shown in the step 515, when the first voltage variation is greater than or equal to the first default value, the HID lamp is identified as a first rated-power lamp. Oppositely, when the first voltage variation is smaller than the first default value, step 517 is performed. As shown in the step 517, when the first voltage variation is smaller than the first default value, the third driving current is outputted to drive the HID lamp at the third predetermined time, and the third voltage, generated by the HID lamp in response to the third driving current, is recorded. It is to be noted that the selected third predetermined time is basically the time after the second driving current drives the HID lamp to reach the voltage steady state. As shown in step 518, the fourth voltage, generated by the HID lamp in response to the third driving current, is recorded at the fourth predetermined time, and the second voltage variation between the third voltage and the fourth voltage is calculated.

As shown in step 519, it is identified whether the second voltage variation is greater than or equal to the second default value. If yes, step 516 is performed. As shown in the step 516, the HID lamp is identified as a second rated-power lamp. Oppositely, when the second voltage variation is smaller than the second default value, as shown in step 520, the HID lamp is identified as the third rated-power lamp. After the rated power of the HID lamp has been identified, the operation parameters of the ballast can be subsequently adjusted according to the rated power of the HID lamp. As mentioned hereinabove, the first default value and the second default value may be determined according to several electric characteristic variation ranges of the electric characteristic variation database, and detailed descriptions thereof will be omitted.

Seventh Embodiment

Figures 23, 24:
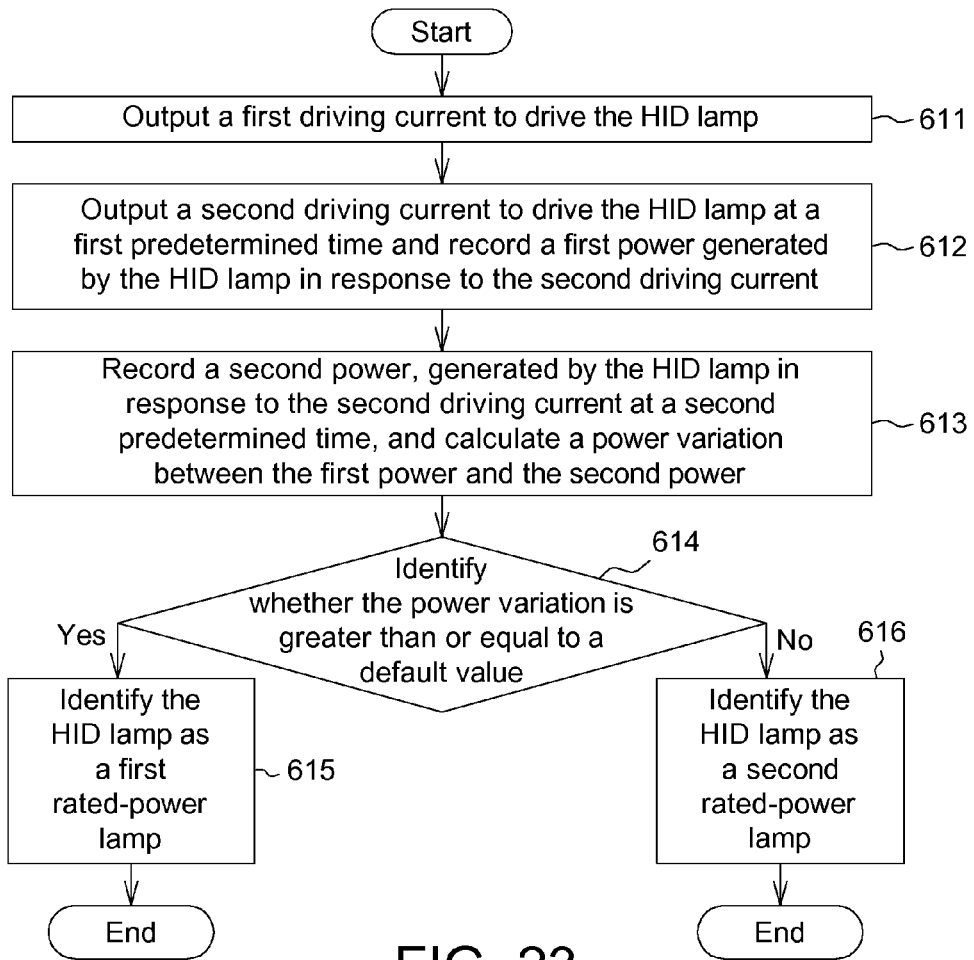
FIG. 23 shows a flow chart of a method for identifying a rated power of a HID lamp according to a seventh embodiment of FIGS. 2 and 4.
FIG. 24 shows a list of powers and times for driving the 70W and 150W HID lamps with the constant current.

Please refer to FIGS. 2, 3 and 23, wherein FIG. 23 shows a flow chart of a method for identifying a rated power of a HID lamp according to a seventh embodiment of FIGS. 2 and 4. In the illustrated seventh embodiment, the first driving signal and the second driving signal are the first driving current and the second driving current, respectively, and the first electric characteristic and the second electric characteristic are the first power and the second power, respectively. The first electric characteristic variation and the first default value are the power variation and the default value, respectively, in the illustrated example.

The method for identifying the rated power of the HID lamp includes the following steps. As shown in step 611, the first driving current is outputted to drive the HID lamp. As shown in step 612, the second driving current is outputted to drive the HID lamp at a first predetermined time, and the first power, generated by the HID lamp in response to the second driving current, is recorded. It is to be noted that the selected first predetermined time is basically the time after the first driving current drives the HID lamp to reach the voltage steady state. As shown in step 613, the second power, generated by the HID lamp in response to the second driving current, is recorded at the second predetermined time, and the power variation between the first power and the second power is calculated.

As shown in step 614, it is identified whether the power variation is greater than or equal to the default value. If yes, step 615 is performed. As shown in the step 615, when the power variation is greater than or equal to the default value, the HID lamp is identified as a first rated-power lamp. Oppositely, when the power variation is smaller than the first default value, as shown in step 616, the HID lamp is identified as a second rated-power lamp. After the rated power of the HID lamp has been identified, the operation parameters of the ballast can be subsequently adjusted according to the rated power of the HID lamp.

Please refer to FIGS. 19, 20 and 24, wherein FIG. 24 shows a list of powers and times for driving the 70W and 150W HID lamps with the constant current. The first power P1 is generated by the HID lamp 12 at the first predetermined time in response to the second driving current ID2. The power Pt represents the power generated by the HID lamp 12 in response to the second driving current ID2 after the second driving current drives the lamp for t seconds.

The first power P1 of the 70W HID lamp is 105W. The power Pt, generated by the 70W HID lamp in response to the second driving current ID2 after the second driving current drives the lamp for 100 seconds, is 94W. The first power P1 of the 150W HID lamp is 85W. The power Pt, generated by the 150W HID lamp in response to the second driving current ID2 after the second driving current drives the lamp for 100 seconds, is 85W.

As shown in FIG. 24, it is obtained that the power variation between the first power P1 and the power Pt of the HID lamp with the rated power of 70W is greater than or equal to 11W within 100 seconds. For the HID lamp with the rated power of 150W, the power variation between its first power P1 and the power Pt is 0. Thus, the time after the second driving current ID2 drives the lamp for 100 seconds is set as the second predetermined time. At this time, the lamp power $P_{lamp}$ is set as the second power P2, and the power variation DW=P1−P2. For the HID lamp with the rated power of 70W, its power variation DW is greater than or equal to 11W. For the HID lamp with the rated power of 150W, its power variation DW is smaller than 11W. That is the electric characteristic variation range of the 70W HID lamp is greater than or equal to 11W, while the electric characteristic variation range of the 150W HID lamp is smaller than 11W.

When the rated power of the HID lamp is identified as 70W or 150W, the default value can be set to 11W. When the power variation DW is greater than or equal to 11W, the rated power of the HID lamp is identified as 70W. Oppositely, when the power variation DW is smaller than 11W, the rated power of the HID lamp is identified as 150W.

Eighth Embodiment

Figure 25:
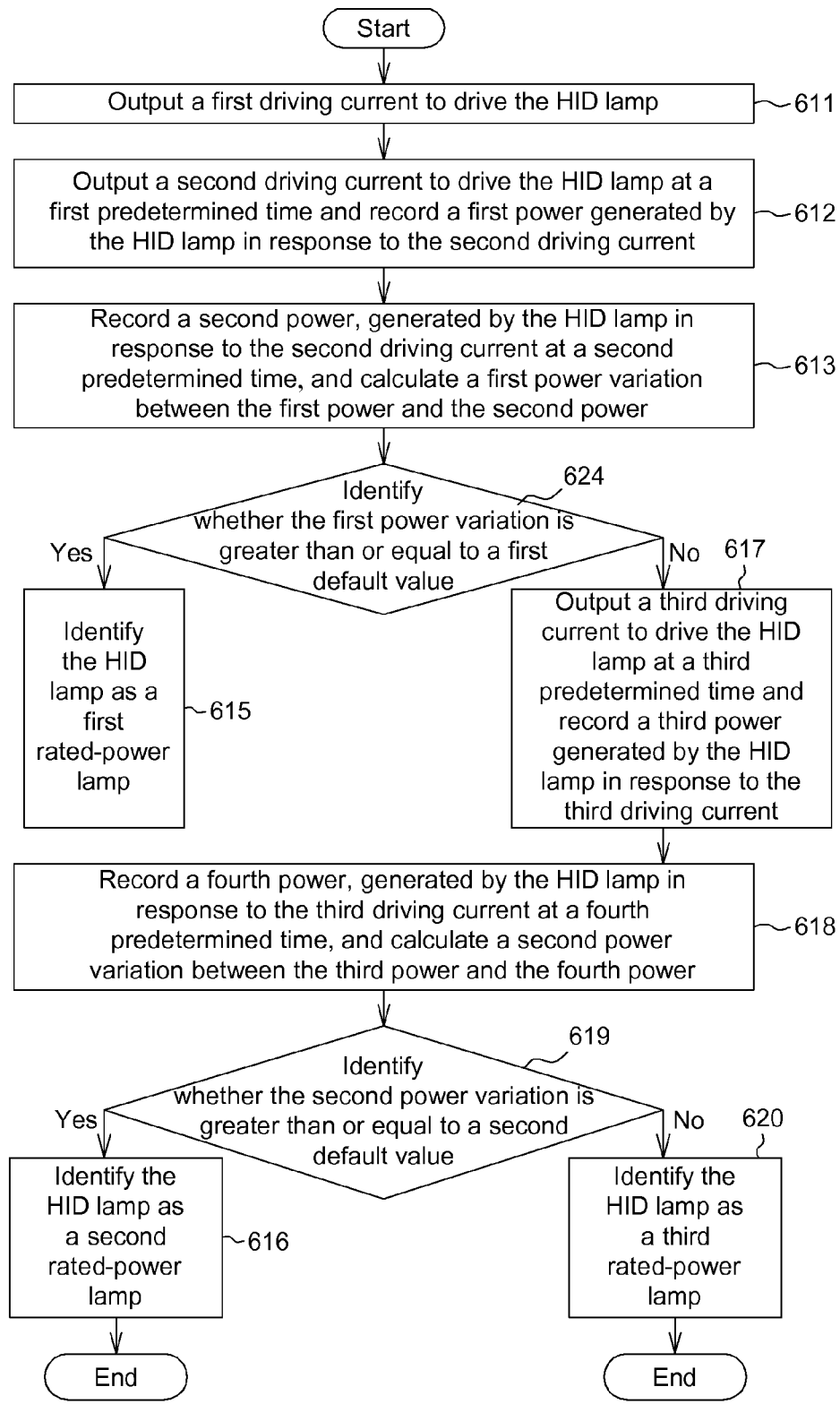
FIG. 25 shows a flow chart of a method for identifying a rated power of a HID lamp according to an eighth embodiment of FIGS. 2 and 4.

Please refer to FIGS. 2, 4 and 25, wherein FIG. 25 shows a flow chart of a method for identifying a rated power of a HID lamp according to an eighth embodiment of FIGS. 2 and 4. The HID lamp 12 generates the third electric characteristic and the fourth electric characteristic at the third predetermined time and the fourth predetermined time, respectively. In the illustrated eighth embodiment, the first driving signal, the second driving signal and the third driving signal are the first driving current, the second driving current and the third driving current, respectively, and the first electric characteristic, the second electric characteristic, the third electric characteristic and the fourth electric characteristic are the first power, the second power, the third power and the fourth power, respectively. The first electric characteristic variation and the second electric characteristic variation are the first power variation and the second power variation in the illustrated example.

The method for identifying the rated power of the HID lamp includes the following steps. As shown in step 611, the first driving current is outputted to drive the HID lamp. As shown in step 612, the second driving current is outputted to drive the HID lamp at a first predetermined time, and the first power, generated by the HID lamp in response to the second driving current, is recorded. It is to be noted that the selected first predetermined time is basically the time after the first driving current drives the HID lamp to reach the voltage steady state. As shown in step 613, the second power, generated by the HID lamp in response to the second driving current, is recorded at the second predetermined time, and the first power variation between the first power and the second power is calculated.

As shown in step 624, it is identified whether the first power variation is greater than or equal to the first default value. If yes, step 615 is performed. As shown in the step 615, when the first power variation is greater than or equal to the first default value, the HID lamp is identified as a first rated-power lamp. Oppositely, when the first power variation is smaller than the first default value, step 617 is performed. As shown in the step 617, when the first power variation is smaller than the first default value, the third driving current is outputted to drive the HID lamp at the third predetermined time, and the third power, generated by the HID lamp in response to the third driving current, is recorded. It is to be noted that the selected third predetermined time is basically the time after the second driving current drives the HID lamp to reach the voltage steady state. As shown in step 618, the fourth power, generated by the HID lamp in response to the third driving current, is recorded at the fourth predetermined time, and the second power variation between the third power and the fourth power is calculated.

As shown in step 619, it is identified whether the second power variation is greater than or equal to the second default value. If yes, step 616 is performed. As shown in the step 616, the HID lamp is identified as a second rated-power lamp. Oppositely, when the second power variation is smaller than the second default value, as shown in step 620, the HID lamp is identified as the third rated-power lamp. After the rated power of the HID lamp has been identified, the operation parameters of the ballast can be subsequently adjusted according to the rated power of the HID lamp. As mentioned hereinabove, the first default value and the second default value may be determined according to several electric characteristic variation ranges of the electric characteristic variation database, and detailed descriptions thereof will be omitted.

Figure 26:
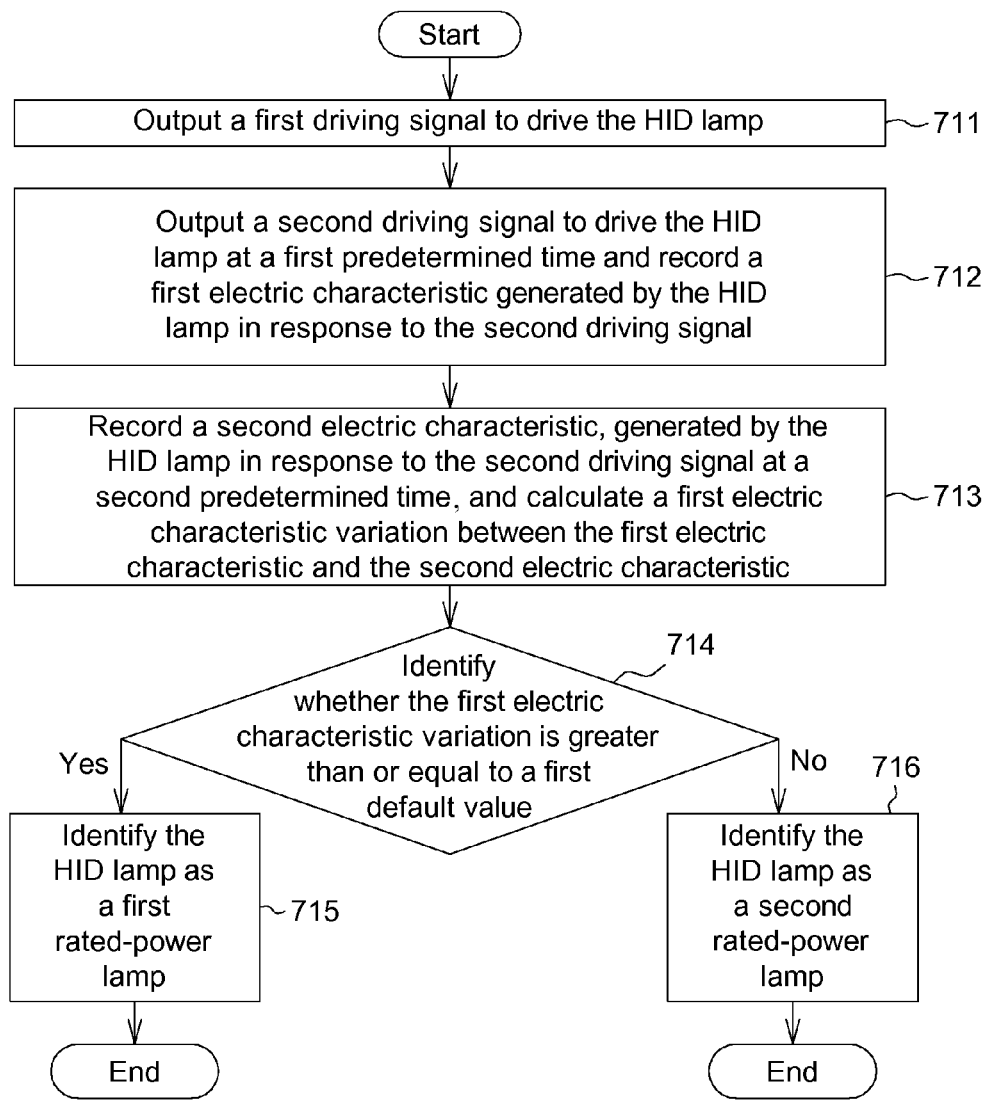
FIG. 26 shows a flow chart showing a method for identifying a rated power of a HID lamp.

To sum up the third, fifth and seventh embodiments, the steps of FIG. 26 may be concluded. FIG. 26 shows a flow chart showing a method for identifying a rated power of a HID lamp. The method for identifying the rated power of the HID lamp includes the following steps. As shown in step 711, the first driving signal is outputted to drive the HID lamp. As shown in step 712, the second driving signal is outputted to drive the HID lamp at the first predetermined time, and the first electric characteristic, generated by the HID lamp in response to the second driving signal, is recorded. The first predetermined time is the time after the first driving signal drives the HID lamp to reach the voltage steady state. As shown in step 713, the second electric characteristic, generated by the HID lamp in response to the second driving signal, is recorded at the second predetermined time, and the first electric characteristic variation between the first electric characteristic and the second electric characteristic is calculated. As shown in step 714, it is identified whether the first electric characteristic variation is greater than or equal to the first default value. If yes, step 715 is performed. As shown in the step 715, when the first electric characteristic variation is greater than or equal to the first default value, the HID lamp is identified as a first rated-power lamp. Oppositely, when the first electric characteristic variation is smaller than the first default value, as shown in step 716, the HID lamp is identified as a second rated-power lamp. After the rated power of the HID lamp has been identified, the operation parameters of the ballast can be subsequently adjusted according to the rated power of the HID lamp.

Figure 27:
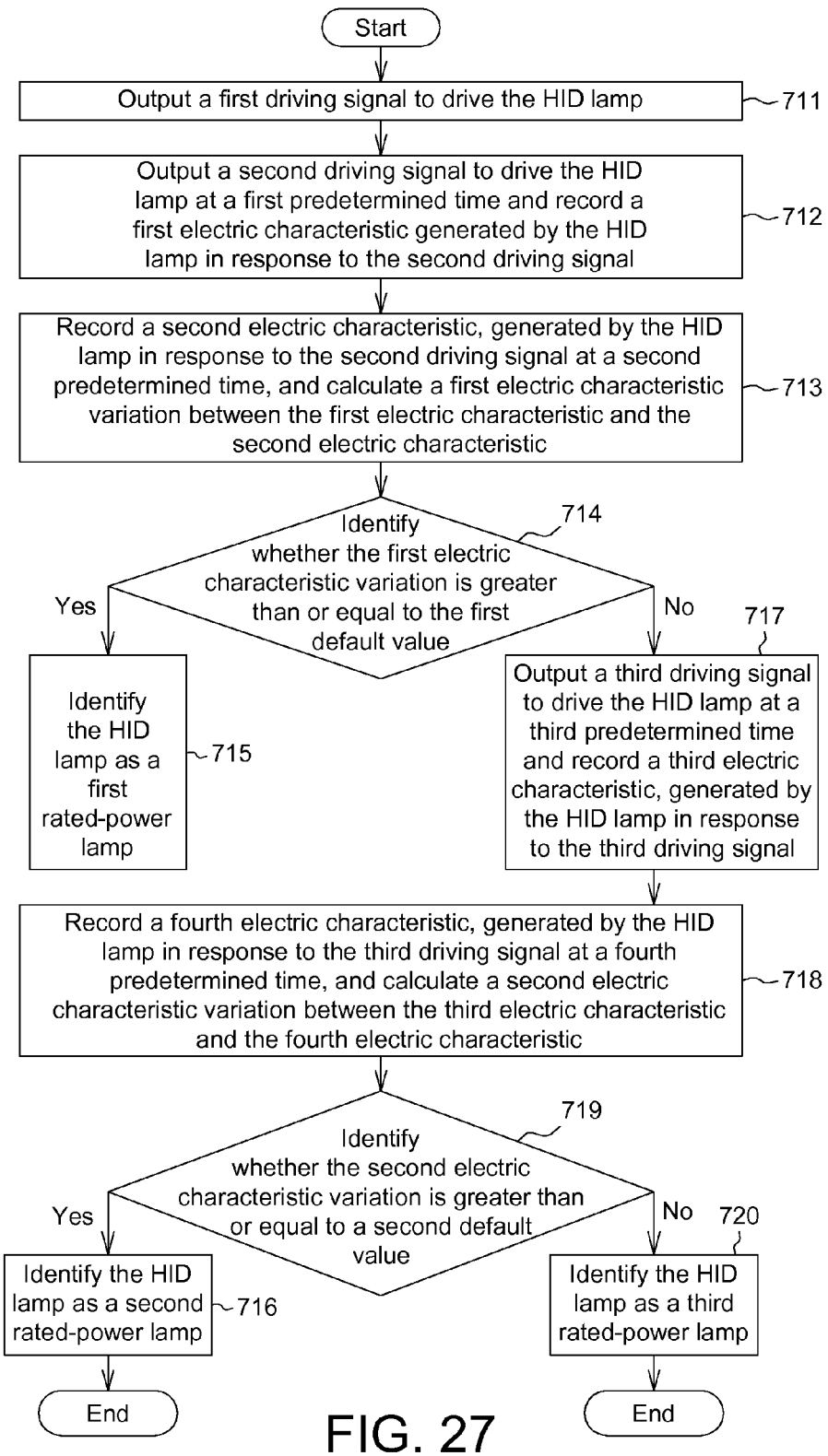
FIG. 27 shows a flow chart of a method for identifying a rated power of a HID lamp.

To sum up the fourth, sixth and eighth embodiments, the steps of FIG. 27 can be concluded. FIG. 27 shows a flow chart of a method for identifying a rated power of a HID lamp. The method for identifying the rated power of the HID lamp includes the following steps. As shown in step 711, the first driving signal is outputted to drive the HID lamp. As shown in step 712, the second driving signal is outputted to drive the HID lamp at a first predetermined time, and the first electric characteristic, generated by the HID lamp in response to the second driving signal, is recorded. The first predetermined time is the time after the first driving signal drives the HID lamp to reach the voltage steady state. As shown in step 713, the second electric characteristic, generated by the HID lamp in response to the second driving signal, is recorded at the second predetermined time, and the first electric characteristic variation between the first electric characteristic and the second electric characteristic is calculated. As shown in step 714, it is identified whether the first electric characteristic variation is greater than or equal to the first default value. If yes, step 715 is performed. As shown in the step 715, when the first electric characteristic variation is greater than or equal to the first default value, the HID lamp is identified as a first rated-power lamp. Oppositely, when the first electric characteristic variation is smaller than the first default value, step 717 is performed. As shown in the step 717, when the first electric characteristic variation is smaller than the first default value, the third driving signal is outputted to drive the HID lamp at the third predetermined time, and the third electric characteristic, generated by the HID lamp in response to the third driving signal, is recorded. The third predetermined time is the time after the second driving signal drives the HID lamp to reach the voltage steady state. As shown in step 718, the fourth electric characteristic, generated by the HID lamp in response to the third driving signal, is recorded at the fourth predetermined time, and the second electric characteristic variation between the third electric characteristic and the fourth electric characteristic is calculated. As shown in step 719, it is identified whether the second electric characteristic variation is greater than or equal to the second default value. If yes, step 716 is performed. As shown in the step 716, the HID lamp is identified as a second rated-power lamp. Oppositely, when the second electric characteristic variation is smaller than the second default value, as shown in step 720, the HID lamp is identified as the third rated-power lamp. After the rated power of the HID lamp has been identified, the operation parameters of the ballast can be subsequently adjusted according to the rated power of the HID lamp. As mentioned hereinabove, the first default value and the second default value may be determined according to several electric characteristic variation ranges of the electric characteristic variation database, and detailed descriptions thereof will be omitted.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for identifying a rated power of a high intensity discharge (HID) lamp, the method comprising the steps of:
   (a) outputting a first driving signal and a second driving signal to drive the HID lamp in order, and calculating a first electric characteristic variation of the HID lamp; and
   (b) identifying the rated power of the HID lamp according to the first electric characteristic variation and a first default value;
   wherein the step (a) comprises:
   outputting the first driving signal to drive the HID lamp;
   outputting the second driving signal to drive the HID lamp at a first predetermined time, and recording a first electric characteristic, generated by the HID lamp in response to the second driving signal; and
   recording a second electric characteristic, generated by the HID lamp in response to the second driving signal at a second predetermined time, and calculating the first electric characteristic variation between the first electric characteristic and the second electric characteristic.

2. The method according to claim 1, further comprising the steps of:
   creating an electric characteristic variation database for recording a plurality of electric characteristic variation ranges respectively corresponding to the HID lamp with various rated powers; and
   determining the first default value according to the electric characteristic variation ranges.

3. The method according to claim 1, wherein the first driving signal and the second driving signal are powers, and the first electric characteristic and the second electric characteristic are voltages or currents.

4. The method according to claim 1, wherein the first driving signal and the second driving signal are currents, and the first electric characteristic and the second electric characteristic are voltages or powers.

5. The method according to claim 1, wherein the first predetermined time is a time when the first driving signal drives the HID lamp to reach a voltage steady state.

6. The method according to claim 1, wherein the step (b) comprises:

identifying whether the first electric characteristic variation is greater than or equal to the first default value; and identifying the HID lamp as a first rated-power lamp when the first electric characteristic variation is greater than or equal to the first default value.

7. The method according to claim 6, wherein the step (b) further comprises:

identifying the HID lamp as a second rated-power lamp when the first electric characteristic variation is smaller than the first default value.

8. The method according to claim 6, wherein the step (b) further comprises:

outputting a third driving signal to drive the HID lamp when the first electric characteristic variation is smaller than the first default value, and recording a second electric characteristic variation of the HID lamp;

identifying whether the second electric characteristic variation is greater than or equal to a second default value; and identifying the HID lamp as a second rated-power lamp when the second electric characteristic variation is greater than or equal to the second default value.

9. The method according to claim 8, further comprising the steps of:

creating an electric characteristic variation database for recording a plurality of electric characteristic variation ranges respectively corresponding to HID lamps with different rated powers; and determining the second default value according to the electric characteristic variation ranges.

10. The method according to claim 8, wherein the step of outputting the third driving signal to drive the HID lamp comprises:

outputting the third driving signal to drive the HID lamp at a third predetermined time and recording a third electric characteristic, generated by the HID lamp in response to the third driving signal; and recording a fourth electric characteristic, generated by the HID lamp in response to the third driving signal at a fourth predetermined time, and calculating the second electric characteristic variation between the third electric characteristic and the fourth electric characteristic.

11. The method according to claim 10, wherein the third driving signal is a power, and the third electric characteristic and the fourth electric characteristic are voltages or currents.

12. The method according to claim 10, wherein the third driving signal is a current, and the third electric characteristic and the fourth electric characteristic are voltages or powers.

13. The method according to claim 10, wherein the third predetermined time is a time after the second driving signal drives the HID lamp to reach a voltage steady state.

14. The method according to claim 8, further comprising the step of:

identifying the HID lamp as a third rated-power lamp when the second electric characteristic variation is smaller than the second default value.

15. A method for identifying a rated power of a high intensity discharge (HID) lamp, the method comprising the steps of:

(a) outputting a first driving signal and a second driving signal to drive the HID lamp in order, and calculating a first electric characteristic variation of the HID lamp; and (b) identifying the rated power of the HID lamp according to the first electric characteristic variation and a first default value;

wherein the first driving signal and the second driving signal are a first driving power and a second driving power, respectively, and the first electric characteristic variation is a first voltage variation, and the step (a) comprises:

outputting the first driving power to drive the HID lamp;

recording a first voltage, generated by the HID lamp in response to the first driving power at a first predetermined time, and outputting the second driving power to drive the HID lamp; and recording a second voltage, generated by the HID lamp in response to the second driving power at a second predetermined time, and calculating the first voltage variation between the first voltage and the second voltage.

16. The method according to claim 15, wherein the first predetermined time is a time after the first driving power drives the HID lamp to reach a voltage steady state.

17. The method according to claim 15, wherein the step (b) comprises:

identifying whether the first voltage variation is greater than or equal to the first default value; and identifying the HID lamp as a first rated-power lamp when the first voltage variation is greater than or equal to the first default value.

18. The method according to claim 17, wherein the step (b) further comprises:

identifying the HID lamp as a second rated-power lamp when the first voltage variation is smaller than the first default value.

19. The method according to claim 17, wherein the step (b) further comprises:

recording a third voltage, generated by the HID lamp in response to the second driving power at a third predetermined time when the first electric characteristic variation is smaller than the first default value; and recording a fourth voltage, generated by the HID lamp in response to a third driving power at a fourth predetermined time, and calculating a second voltage variation between the third voltage and the fourth voltage.

20. The method according to claim 19, wherein the third predetermined time is a time after the second driving power drives the HID lamp to reach a voltage steady state.

* * * * *